US 12,123,816 B2

(12) United States Patent
Lamers et al.

(10) Patent No.: US 12,123,816 B2
(45) Date of Patent: Oct. 22, 2024

(54) VIBRATION-FREE CRYOGENIC COOLING

(71) Applicant: FEI Company, Hillsboro, OR (US)

(72) Inventors: Ronald Lamers, Budel (NL); Hans Persoon, Waalre (NL); Alphons Theophile Augusta Maria de Waele, Veldhoven (NL); Theo Ruijl, Oirschot (NL); Hugo van Leeuwen, Eindhoven (NL)

(73) Assignee: FEI Company, Hillsboro, OR (US)

(*) Notice: Subject to any disclaimer, the term of this patent is extended or adjusted under 35 U.S.C. 154(b) by 158 days.

(21) Appl. No.: 17/353,604

(22) Filed: Jun. 21, 2021

(65) Prior Publication Data
US 2022/0404247 A1    Dec. 22, 2022

(51) Int. Cl.
*G01N 1/42* (2006.01)
*F25D 19/00* (2006.01)
(Continued)

(52) U.S. Cl.
CPC .............. *G01N 1/42* (2013.01); *F25D 19/006* (2013.01); *G01N 1/44* (2013.01); *H01J 37/261* (2013.01); *H01J 2237/2001* (2013.01)

(58) Field of Classification Search
CPC ....... H01J 2237/2001; H01J 2237/2002; H01J 2237/2003; H01J 2237/2004;
(Continued)

(56) References Cited

U.S. PATENT DOCUMENTS 5,056,317 A * 10/1991 Stetson ................ F25B 9/14
60/520
5,654,546 A * 8/1997 Lindsay ................ B82Y 35/00
250/442.11
(Continued)

FOREIGN PATENT DOCUMENTS

CN    110164744 A    8/2019
CN    110189972 A    8/2019
(Continued)

OTHER PUBLICATIONS

Radebaugh, "About Cryogenics," The MacMillian Encyclopedia of Chemistry, New York, 2002, 4 pages, available from https://trc.nist.gov/cryogenics/aboutCryogenics.html (2002).
(Continued)

*Primary Examiner* — Sean M Luck
(74) *Attorney, Agent, or Firm* — Klarquist Sparkman, LLP

(57) ABSTRACT

Apparatus and methods are disclosed for vibration-free cryogenic cooling, suitable for TEM and other analytic equipment. A thermal battery includes one or more of: a cryocooler, a thermal switch, a thermal cold storage reservoir, and a cold finger. The thermal reservoir is mounted outside a sample chamber. The cold finger provides thermal coupling between the reservoir and a sample holder inside the sample chamber. In varying embodiments, sample holder and sample temperatures are regulated by a heater or by an inline variable thermal resistor. Cyclic phased operation includes cooling the reservoir, decoupling the cryocooler
(Continued)

from the reservoir, and temperature-regulated passive vibration-free thermal energy extraction from sample to reservoir. The described system delivers a stand time of 12 hours at 20 K. Temperature regulation, a hybrid thermal switch, damping of thermal fluctuations, and material selection are described.

20 Claims, 12 Drawing Sheets

(51) Int. Cl.
 *G01N 1/44* (2006.01)
 *H01J 37/26* (2006.01)
(58) Field of Classification Search
 CPC ............ H01J 37/32724; H01J 37/3497; H01J 37/261; G01N 1/42; G01N 1/44; F25D 19/006
 See application file for complete search history.

(56) References Cited

U.S. PATENT DOCUMENTS

| | | | |
|---|---|---|---|
| 5,816,052 A | 10/1998 | Foote et al. | |
| 5,986,270 A * | 11/1999 | Bormans | H01J 37/20 850/16 |
| 6,330,800 B1 * | 12/2001 | Price | F25B 9/10 60/520 |
| 10,068,745 B2 * | 9/2018 | Yaguchi | H01J 37/16 |
| 2002/0145940 A1 * | 10/2002 | Terentiev | H02K 49/106 366/273 |
| 2007/0252090 A1 * | 11/2007 | van de Water | H01J 37/20 250/429 |
| 2008/0076194 A1 * | 3/2008 | Blake | H01J 37/3171 438/5 |
| 2008/0092556 A1 * | 4/2008 | Stein | F25D 3/00 62/529 |
| 2009/0242795 A1 * | 10/2009 | Chao | G01N 1/42 250/442.11 |
| 2010/0242500 A1 | 9/2010 | Laskaris et al. | |
| 2012/0112064 A1 * | 5/2012 | Nagakubo | G01N 1/286 250/442.11 |
| 2012/0120226 A1 * | 5/2012 | de Jonge | H01J 37/20 348/80 |
| 2012/0167598 A1 * | 7/2012 | Diederichs | F25D 19/00 62/50.1 |
| 2012/0248343 A1 * | 10/2012 | Nagai | G03F 7/70033 250/504 R |
| 2013/0014528 A1 * | 1/2013 | Stabacinskiene | G01N 23/20033 62/129 |
| 2013/0105108 A1 * | 5/2013 | Zywno | G05D 23/19 165/11.1 |
| 2013/0288182 A1 | 10/2013 | Branton et al. | |
| 2014/0262157 A1 * | 9/2014 | Citver | H01J 37/3171 165/104.21 |
| 2015/0015260 A1 * | 1/2015 | Harrison | H01F 6/06 324/318 |
| 2015/0340199 A1 * | 11/2015 | Nagakubo | H01J 37/20 250/443.1 |
| 2016/0071689 A1 * | 3/2016 | de Jong | H01J 37/26 250/311 |
| 2016/0181059 A1 * | 6/2016 | Vystavel | H01J 37/16 250/442.11 |
| 2016/0276126 A1 * | 9/2016 | Zandbergen | H01J 37/26 |
| 2017/0221676 A1 * | 8/2017 | Sunaoshi | H01J 37/28 |
| 2017/0372916 A1 * | 12/2017 | Kudo | H01L 21/67248 |
| 2018/0051852 A1 * | 2/2018 | Wikus | F25D 19/006 |
| 2018/0114671 A1 * | 4/2018 | Mitchels | H01J 37/261 |
| 2019/0131105 A1 * | 5/2019 | Van De Water | H01J 37/20 |
| 2019/0322374 A1 * | 10/2019 | Moon | B64D 13/08 |
| 2020/0141846 A1 * | 5/2020 | Zandbergen | H01J 37/20 |
| 2020/0185187 A1 * | 6/2020 | Negishi | H01J 37/3053 |
| 2020/0185248 A1 * | 6/2020 | Sarode Vishwanath | H01L 21/6833 |
| 2020/0395197 A1 * | 12/2020 | Garcia De Gorordo | H01L 21/67109 |
| 2021/0055534 A1 | 2/2021 | Zandbergen | |
| 2021/0082730 A1 * | 3/2021 | Sarode Vishwanath | H01J 37/32724 |

FOREIGN PATENT DOCUMENTS

| | | |
|---|---|---|
| CN | 110189973 A | 8/2019 |
| CN | 209804583 U | 12/2019 |
| CN | 209804586 U | 12/2019 |
| JP | H09-306405 A | 11/1997 |
| JP | H11-354317 A | 12/1999 |

OTHER PUBLICATIONS

ThermoFisher Scientific, "Cryo Electron Tomography Workflow," 5 pages, downloaded from https://www.thermofisher.com/US/en/home/electron-microscopy/life-sciences/cryo-tomography/cryo-tomography-workflow.html on Apr. 4, 2021.

ThermoFisher Scientific, "Single Particle Analysis Workflow Structural," 6 pages, downloaded from https://www.thermofisher.com/US/en/home/electron-microscopy/life-sciences/single-particle-analysis-cryo-em/single-particle-analysis-workflow.html on Apr. 4, 2021.

Yamasaka, "Independent control of electrical and heat conduction by nanostructure designing for Si-based thermoelectric materials," *Scientific Reports* 6, 22838; DOI: 10.1028/srep22838, pp. 1-8 (Mar. 2016).

Wikipedia, "CryoCooler", pp. 1-6, downloaded from https://en.wikipedia.org/wiki/Cryocooler on Apr. 14, 2021.

Extended European Search Report dated Mar. 22, 2023, from European Patent Application 22178319.4, 23 pages.

Lehmann et al., "A simple cryostat for optical measurements in a magnetic field between 3.6 and 300 K," *Journal of Physics E: Scientific Instruments*, vol. 3, No. 4, pp. 326-327 (Apr. 1, 1970).

"Rare earths make super heat sinks," *Machine Design, Penton Media*, vol. 72, No. 22, p. 45 (Nov. 16, 2000).

Wysokinski et al., "Comparative evaluation of erbium and lead regenerator materials for low temperature cryocoolers," *Cryogenics*, vol. 42, No. 8, pp. 463-467 (Aug. 1, 2002).

\* cited by examiner

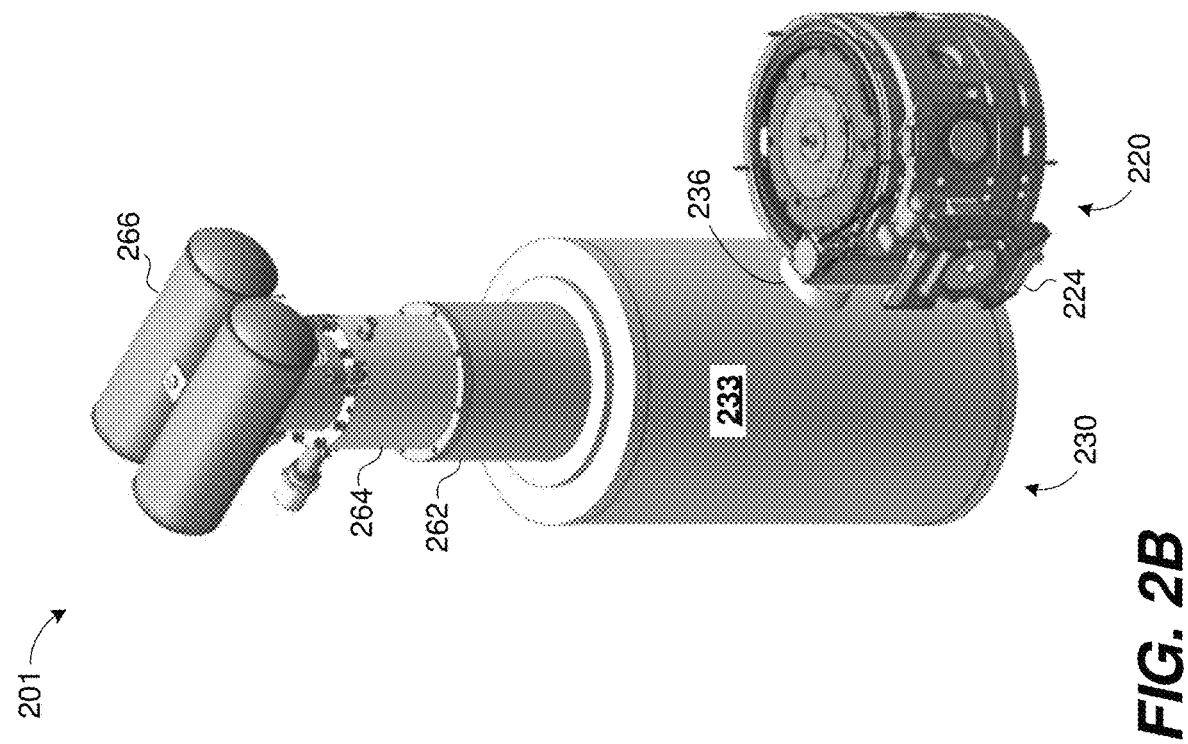
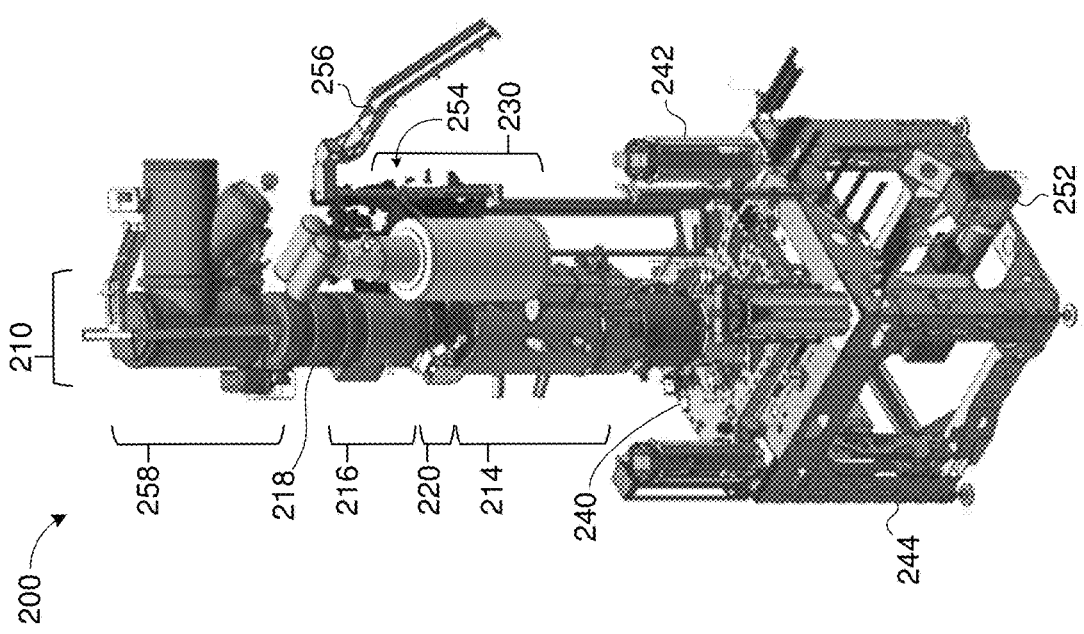
FIG. 2A
FIG. 2B

VIBRATION-FREE CRYOGENIC COOLING

FIELD

The disclosure pertains to cryogenic cooling for analytic equipment.

BACKGROUND

As the frontiers of science advance, analytic equipment must keep pace with progressively more demanding requirements. A new generation of analytic applications requires long measurement times on the order of 10 hours or more, cryogenic sample temperatures below 77 K, temperature stability better than 1 K, and sub-nanometer position stability. In addition, the sample can be in a very congested environment. Current approaches cannot meet such stringent requirements or operating conditions. Accordingly, there remains a need for improved technology for cooling samples in analytic equipment.

SUMMARY

In brief, the disclosed technologies provide vibration-free cryogenic cooling suitable for a transmission electron microscope (TEM) and other analytic equipment. In examples, a thermal battery can include a cryocooler, a thermal switch, a thermal cold storage reservoir, and a cold finger. The thermal reservoir can be mounted outside a sample chamber. The cold finger can provide thermal coupling between the reservoir and a sample holder inside the sample chamber. The temperature of the sample holder or sample can be regulated by a heater or by an inline variable thermal resistor. Phases of operation can include cooling the reservoir, decoupling the cryocooler from the reservoir, and passive vibration-free thermal energy extraction from sample to reservoir with temperature regulation. Embodiments can deliver a stand time of 12 hours with sample temperature maintained at 20 K±0.1 K, and correspondingly longer stand times at higher sample temperatures. The operational phases can be repeated cyclically for even longer analytical studies.

In a first aspect, the disclosed technologies can be implemented as an apparatus having a thermal reservoir positioned outside a sample chamber and a longitudinal member extending from the thermal reservoir into the sample chamber. The longitudinal member is flexibly couplable to a sample holder in the sample chamber.

In some examples, the thermal reservoir can be configured to passively extract thermal energy from the sample holder to maintain a temperature of the sample holder within a predetermined operating temperature range for at least a predetermined time duration. The apparatus can further include a heater thermally coupled to the sample holder, a temperature sensor thermally coupled to the sample holder, and a controller coupled to receive a signal from the temperature sensor and to drive the heater. The heater can be configured to actively provide thermal energy to the sample holder to regulate the temperature of the sample holder. The thermal energy can flow from the sample holder to the thermal reservoir along a first path defined by the longitudinal member. The apparatus can also include a thermal resistor positioned on the first path to increase thermal resistance between the thermal reservoir and the heater. The disclosed technologies can be implemented as a thermal battery incorporating the above apparatus, together with a cryocooler and a thermal switch coupling the cryocooler and the thermal reservoir.

In additional examples, the thermal energy from the sample to the thermal reservoir can flow along a first path, and the apparatus can include a discrete component having a variable thermal resistance, situated on the first path and configured to control a thermal energy flow along the first path. In some examples, the discrete component can be a passive temperature regulator while, in other examples, the apparatus can include a controller coupled to the discrete component and configured to control the discrete component. The apparatus can include a discrete thermal mass situated within the sample chamber and thermally coupled to the longitudinal member and/or the sample holder. The predetermined time duration can be in a range 2-30 hours. The operating temperature range can have a sample temperature setpoint between 10 K and 50 K, with a tolerance between 10 mK and 3 K.

In further examples, the thermal reservoir can include a primary thermal reservoir (with the longitudinal member being a first longitudinal member coupled to the primary thermal reservoir), a secondary thermal reservoir positioned outside the sample chamber, and a second longitudinal member extending from the secondary thermal reservoir into the sample chamber. The second longitudinal member can couple to a thermal shield near proximate to the sample holder. The secondary thermal reservoir can be configured to passively extract thermal energy from the thermal shield. The apparatus can include a cryocooler in thermal contact with the secondary thermal reservoir and coupled to the primary reservoir through a thermal switch. The apparatus can be configured to passively extract thermal energy from the sample holder to the primary reservoir with the thermal switch in an open state. The secondary thermal reservoir can surround the primary reservoir and the second member can be annularly disposed around the first member. The secondary thermal reservoir can incorporate copper or a copper alloy. The primary thermal reservoir can incorporate erbium or an erbium alloy. The disclosed technologies can be implemented as a system incorporating any of the apparatuses above and incorporating a transmission electron microscope (TEM) incorporating the sample chamber and the sample holder.

In a second aspect, the disclosed technologies can be implemented as a method of controlling a temperature of a sample in a sample chamber. A thermal reservoir positioned outside the sample chamber is charged. The charging is stopped after the thermal reservoir has reached a target setpoint. The thermal reservoir is thermally coupled to the sample through a longitudinal member. The thermal energy flow to or from the sample is adjusted to regulate the temperature of the sample.

In some examples, the adjusting can include driving a heater in response to a signal indicating a temperature within the sample chamber. The adjusting can be performed, at least in part, by a variable series thermal resistor. The adjusting can include driving the variable series thermal resistor from a controller in response to a signal indicating a temperature within the sample chamber. The charging can be performed by a cryocooler. The stopping can include turning off the cryocooler and changing the state of a thermal switch coupling the cryocooler to the thermal reservoir, from a closed state to an open state. In further examples, the thermal reservoir can be partially or wholly recharged after a predetermined time duration.

In another aspect, the disclosed technologies can be implemented as a system incorporating a transmission electron microscope (TEM), a sample holder, and a regulated thermal battery. The TEM includes an electron source, a condenser lens, a sample chamber, an objective lens, and an imager. The sample holder is situated within the sample chamber. The regulated thermal battery includes a thermal reservoir situated outside the sample chamber, a thermal strap coupling the thermal reservoir to the sample holder, and a temperature regulator. The temperature regulator is configured to control a thermal energy flow from the sample holder to the thermal reservoir to regulate sample temperature.

In some examples, the system can be configured to maintain a stable cryogenic condition of a sample in the sample holder for six continuous hours, wherein the stable cryogenic condition having (i) a temperature variation less than or equal to 200 mK at a temperature setpoint in a range between 20-80 K, (ii) a positional drift of the sample less than or equal to 1 nm/minute, and (iii) vibrations less than or equal to 1 pm rms over a band 1-2000 Hz.

In further examples, the system can include a sample shield situated within the sample chamber, the thermal strap can be a first strap, and the regulated thermal battery further include: a secondary reservoir, first and second cryocooler stages, first and second thermal switches, and a second strap coupling the secondary reservoir to the sample shield. The first thermal switch can be coupled between the first cryocooler stage and the secondary reservoir. The first cryocooler stage can be configured to charge the secondary reservoir with the first thermal switch in a closed state. The second thermal switch can be coupled between second cryocooler and the thermal reservoir. The second cryocooler can be configured to charge the thermal reservoir with the second thermal switch in a closed state.

The foregoing and other objects, features, and advantages of the invention will become more apparent from the following detailed description, which proceeds with reference to the accompanying figures.

BRIEF DESCRIPTION OF THE DRAWINGS

FIGS. 2A-2B are diagrams illustrating a second example system in which the disclosed technologies can be deployed.

DETAILED DESCRIPTION

Introduction

Figure 1:
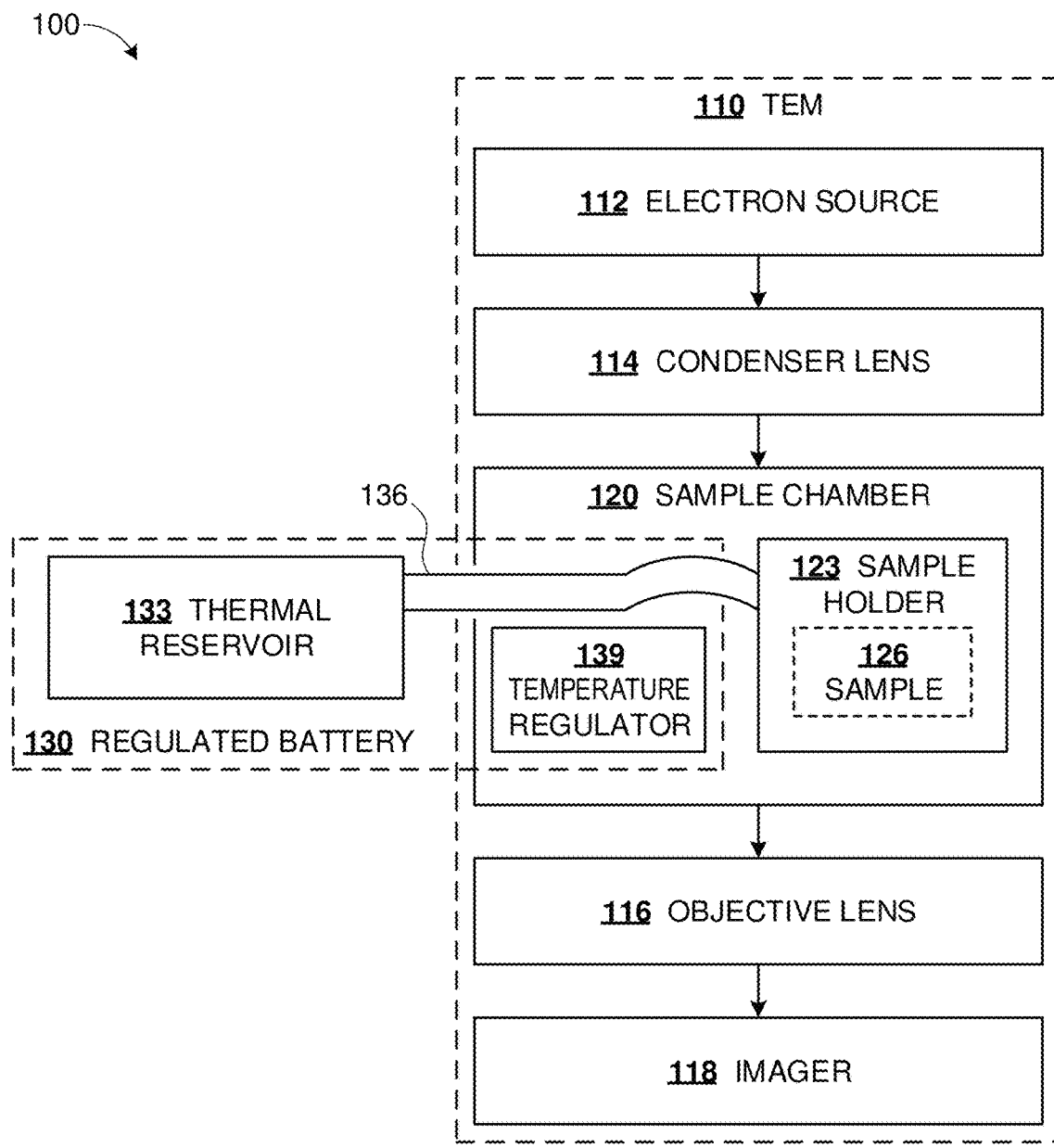
FIG. 1 is a diagram of a first example system in which the disclosed technologies can be deployed.

With advances in electron microscopy, 3-D reconstruction software, and computational power, it has become possible to undertake precise imaging and reconstruction of objects on the order of 100 nm size and below. Areas of particular interest include biology, where studies related to viruses—including novel coronaviruses—are planned, and material science, where nanotechnology continues to develop new structures and new compositions. For high resolution, it can be desirable to minimize sample vibration. Conventional technologies with liquid nitrogen or liquid helium reservoirs suffer from vibration induced by boiling liquid. Further, as the size of sample particles grows, so too does the number of required images and consequently the amount of time to perform one study. At the same time, the sample stability required for accurate reconstruction becomes more stringent. For some applications, atomic motions at 77 K are enough to compromise image resolution or sample stability. Additionally, radiation damage to a sample can compromise image quality at the long imaging times used for ultra-high resolution, and such radiation damage can be reduced at lower temperatures. Accordingly, there is a vital need to maintain stable cold temperatures as low as 20 K, or even lower, free of external vibrations, for 6 hours, 12 hours, or more. The disclosed technologies address this need. Atomic motion can be held to 1-10 pm amplitude, or below the size of most atoms.

Examples described below implement a solid thermal reservoir to provide vibration-free cooling for an extended stand time. Moreover, cyclic operation can be supported to continue a study on a single sample over a succession of stand times. That is, when the thermal reservoir has warmed up and can no longer maintain the sample at a particular temperature setpoint (e.g., 20 K), the analytic study can be paused while the thermal reservoir is recharged. Thus, with a 12 hour stand time in a single cycle and a 6 hour recharge time, disclosed embodiments can repeatedly cycle for prolonged studies lasting a hundred hours, a thousand hours, or even more, with a working duty cycle above 60%. With 6 hour stand time and 6 hour recharge time, extended operation with about 50% duty cycle can be achieved.

Another feature of some examples described below is temperature regulation. Without regulation, gradual warming of the reservoir could lead to shift in the equilibrium temperature of the sample holder and sample beyond a design specification. Temperature regulation can be implemented as active regulation using a heater to compensate for the monotonic decrease in thermal energy flow over the stand time, as the reservoir warms up and temperature difference between sample and reservoir decreases. In other examples, temperature regulation can be provided without introduction of excess heat, by providing a variable thermal resistor in the cooling path, to throttle thermal energy flow from the sample to the reservoir when the temperature difference between them is large.

Various workflows can be implemented for 3-D image reconstruction studies. In a single particle workflow, a sample can contain many identical copies of a target object having a distribution of orientations. A survey scan can locate candidate objects at respective orientations, and images can be acquired at different object rotations by selecting candidate objects appropriately. The images can be reconstructed together to determine 3-D structure of the target object.

In a tomographic workflow, a single copy of the target object can be located within a sample volume, and its orientation can be determined, if not already known. This object can be thinned, for example by focused ion beam milling (FIB), to obtain a sample suitable for TEM imaging. In the TEM, images can be acquired at different orientations, using the sample holder to progressively tilt the sample. As for the single particle workflow, the images can be reconstructed to determine 3-D structure of the target object.

Terminology

The usage and meaning of all quoted terms in this section applies throughout this disclosure unless clearly indicated otherwise or repugnant to the context. The terminology below extends to related word forms.

In the context of cooling, "active" cooling is performed by a machine having one or more moving parts, such as a cryocooler with a compressor or one or more pistons. In some examples of the disclosed technologies, active cooling can be used to charge a thermal reservoir. In contrast, "passive" cooling is performed without moving parts. In examples of the disclosed technologies, a thermal reservoir, once charged, can provide passive cooling to a sample and to other devices in a sample chamber, i.e. with any cryocoolers switched OFF. In common examples, active cooling can discharge heat from a cooled sample to a sink at a higher temperature than the sample, while passive cooling can absorb heat from the cooled sample in a sink at a lower temperature than the sample. The presence of incidental movable components, such as a copper braid which can move along with a sample holder, does not preclude a characterization as passive cooling, because the motion of the copper braid does not perform cooling. In the context of temperature regulation, "passive" regulation is performed by a device having no input control signal. A variable thermal resistor can have a thermal resistance varying according to its temperature or the temperature of its immediate surroundings, but without any control signal, and can be a passive regulator. In contrast, "active" regulation is performed by a device having an input control signal. In some examples of the disclosed technology, a heater or a controlled variable thermal resistor can be used for active temperature regulation, for example in a servo loop. Analog or digital control can be used, including pulse width modulation (PWM), pulse frequency modulation (PFM), or other techniques. Considering an entire servo loop as a device does not preclude its classification as an active regulator, because an internal component within the servo loop (e.g. a heater) still has an input control signal. In some examples of the disclosed technology, passive cooling and active regulation can co-exist.

The term "annular" describes ring shaped objects, having the general form of a torus, and extends to hollow cylinders. The presence of additional holes, such as screw holes or even a wire mesh cylinder such as a Kellem® cord grip (Hubbell Inc., Shelton, CT) does not preclude such objects from being described as annular.

A "controller" is an electronic device which can be coupled to a load or actuator to effect a change in a physical parameter. Some controllers can include a microprocessor which can be programmed to execute machine readable instructions. The descriptions herein of computing devices are generally applicable to such controllers. Such controllers can include additional electronic circuitry such as filters and amplifiers. Other controllers can include analog circuitry such as filters and amplifiers without any microprocessors.

A "cryocooler" is a refrigerator providing cooling at cryogenic temperatures. Common cryocoolers can include a compressor, an expander, one or more heat exchangers, and can include one or more pistons. Common types of cryocoolers include Gifford-McMahon type, Linde-Hampson type, pulse tube type, and Stirling-type.

The term "cryogenic" refers to temperatures below 100 K, to equipment or processes operating at temperatures below 100 K, or to material properties or parameters below 100 K. Materials can occasionally be characterized by terms (such as "metal," or "conductive") which refer to common characterization of such materials at room temperature, and not necessarily according to their properties at cryogenic temperatures.

A "discrete component" is a device that is distinguishable from its surroundings based on material properties, a label, or packaging. In some examples, a thermal resistor can be integrated into a cold finger. The thermal resistor can have thermal conductivity different from the thermal conductivity of adjacent copper rod and can be a discrete component within the cold finger structure.

An "electron microscope" is a type of analytic equipment in which a sample is illuminated by an electron beam, and resulting particles or electromagnetic radiation are used to form an image. A scanning electron microscope (SEM) images reflected, secondary, or backscattered particles or radiation from the sample surface on which the electron beam is incident. Because beam interactions detected by a SEM occur at or near this surface, a SEM can operate on samples of arbitrary thickness. In contrast, a transmission electron microscope (TEM) images transmitted electrons (including scattered electrons). TEM operates on samples of about 10-150 nm thickness, which can be mounted on a grid for mechanical support and thermal conductivity; in turn the grid can be held in a sample holder. TEM can provide magnifications up to and exceeding 50 million, while SEM magnifications are usually limited to about 2 million. A sample chamber in a high performance TEM can be small and congested: apparatus that can be accommodated in a SEM sample chamber often cannot fit inside a TEM sample chamber. A common size for a TEM sample chamber is about 60 mm diameter and 35 mm height, while a SEM sample chamber can be 5-10× larger in each dimension, i.e. about 100-1000× larger volume. In this disclosure, scanning transmission electron microscopes (STEM), which perform imaging of transmitted electrons, are considered to be TEMs.

A "heater" is a device that converts electrical energy into thermal energy.

A "longitudinal member" is a solid object having a length more than three times any cross-sectional (transverse) dimension. Some longitudinal members of interest in this disclosure are cold fingers, which can be in the form of a copper rod or tube, and which can have one or more embedded devices, such as a thermal resistor. While some longitudinal members are rigid, this is not a requirement, and longitudinal members can include flexible structures such as wires, multi-strand wire bundles, wire braids; foils, ribbons, or other sheet forms; hinges, pin joints, or other linkages; helical, corrugated, or other spring-like structures. Particularly, a longitudinal member can include one or more rigid components and one or more flexible components. A longitudinal member can be formed as a group of attached longitudinal members. The term "strap" is generally synonymous with "longitudinal member" and extends to objects and assemblies of diverse structures. A "thermal strap" is a strap providing thermal coupling or thermal energy flow along its length, or between devices at its ends.

Terms such as "operating [attribute]" (e.g. "operating conditions" or "operating temperature") refer to values of the [attribute] during the stand time of a disclosed embodiment, typically when a thermal reservoir is providing passive cooling to a sample and the sample is in suitable condition for analytic procedures.

The term "regulate" refers to maintaining a parameter (the "regulated parameter") within a predetermined tolerance. A "regulator" is a device or combination of devices configured to regulate a target parameter. In examples, a regulator can (i) sense a first parameter and (ii) control a second parameter, to achieve (iii) regulation of a third parameter. In varying examples, some of the first, second, and third parameters can be the same, or all can be different. In some disclosed examples, a servo loop senses a temperature on a bridge (first parameter), controls thereby current to a heater (second parameter), to regulate temperature of a sample (third parameter). In other disclosed examples, a passive variable thermal resistor responds to its immediate temperature (first parameter) by changing its thermal resistance (second parameter), to regulate the temperature of a remote sample (third parameter).

A "sample" is a physical object that can be subject to an analytic procedure with a TEM or other analytic equipment. A sample can be retained or moved by a "sample holder," which can be a multi-prong gripper in some examples. The sample and sample holder can be situated within a "sample chamber" for the purpose of imaging, analysis, or associated process operations. Within the sample chamber, a "shield" (sometimes dubbed "cryobox") can provide a thermal shield to reduce radiative heat transfer between the sample and proximate warm components, and can also serve to protect the sample from contaminants.

A "sensor" is a device that having an electrical property, or generating an electrical signal, the value of which signal or property is indicative of a physical parameter. Some sensors of interest in this disclosure are temperature sensors.

"Specific heat capacity," denoted $c_p$, is the amount of thermal energy required to make a unit temperature increase in a unit amount of a given material, at a constant pressure. The amount can be specified as a mass (in which case exemplary units for $c_p$ can be J kg$^{-1}$ K$^{-1}$) or volume (in which case exemplary units for $c_p$ can be J cm$^{-3}$ K$^{-1}$).

"Stand time" is a continuous interval of time over which target operating conditions of a system can be met. In examples of the disclosed technology, a thermal battery can maintain a sample at a temperature setpoint within a predetermined tolerance for the stand time. The target operating conditions can include additional requirements, such as for temperature or position fluctuations or drift.

A "thermal battery" is a system comprising a thermal reservoir, a means of charging the thermal reservoir, and a facility (such as a port or a cold finger) for delivering thermal energy (heat or cold) to a load. The load itself is not part of the thermal battery.

"Thermal conductivity" is an intensive property of a material indicating a ratio of thermal energy flow density (e.g. power per cross-sectional area) to a temperature gradient (e.g. temperature change per length) in a direction of the thermal energy flow. A device of a given material and dimensions can have a "thermal conductance" (ratio of thermal energy flow (power) to temperature difference) and a "thermal resistance" (inverse of thermal conductance). Such a device can be dubbed a "thermal resistor."

"Thermal energy" refers to both "cold" and "heat," wherein cold provided to an object is an alternate description of heat being removed from the object, and cold removed from an object is an alternate description of heat being provided to the object. Thermal energy can be delivered to and stored in material of a thermal reservoir, and energy can be extracted from such material. Thermal energy can be specified in J, kWh, Btu, or similar units. A "thermal energy flow" (or simply "flow") refers to a rate of thermal energy transfer, which has dimensions of power and can be denoted in W, Btu/hr, or similar units. Thermal energy flows can be positive or negative. Although, for convenience, such flows are often described in a conventional sense (i.e. a direction in which heat energy flows), the use of words such as "extracts" or "delivers" is not limiting and such description can extend to flows in an opposite direction.

A "thermal reservoir" is a contiguous mass of material configurable to receive, store, and deliver thermal energy. Some examples herein implement thermal reservoirs using solid blocks of metal, but this is not a requirement. In varying examples, liquids, solid-liquid combinations, solid pellets in a carrier medium, or liquid capsules can also be used. A cryogenic thermal reservoir is "charged" by cooling it, such by a mechanical cryocooler or from another thermal reservoir, causing cold to be stored in the reservoir, and "discharged" by warming it, such as when the thermal reservoir is used to extract thermal energy from a sample chamber.

A "variable thermal resistor" is a thermal resistor whose thermal resistance can change over time, either spontaneously (for example due to a change in the immediate ambient temperature of the thermal resistor) or in response to an external control input.

First Example System

FIG. 1 is a diagram 100 of a first example system, in which a regulated thermal battery 130 provides cooling to a sample holder 123 within a transmission electron microscope (TEM) 110.

Within TEM 110, an electron beam can be generated by electron source 112. The beam can be focused onto a sample position within sample chamber 120 by condenser lens 114. Sample 126 can be held by sample holder 123 positioned within sample chamber 120. Although the illustrated system can be used to image or analyze sample 126, the dotted outline indicates that the sample, per se, is not part of the illustrated system. After passing through sample 126, the transmitted electron beam can be focused by objective lens 116 onto an imaging plane of imager 118.

Regulated thermal battery 130 can be coupled to TEM 110, and in particular to sample holder 123 within sample chamber 120. Battery 130 can include thermal reservoir 133 situated outside the sample chamber 120. Thermal strap 136 can be coupled between sample holder 123 and reservoir 133 to provide heat exchange between sample holder 123 and reservoir 133. Additionally, battery 130 can include temperature regulator 139. Regulator 139 can control flow of thermal energy between reservoir 133 and sample holder 123 (and, thereby, to or from sample 126), to regulate the temperature of the sample holder (and, by extension, the temperature of the sample).

Numerous extensions or variations of the illustrated system can be implemented within the scope of the disclosed technologies. In some examples, TEM 110 can be a scanning transmission electron microscope (STEM), while in other examples, TEM 110 can be replaced by other analytic or process equipment having similar performance requirements. Examples of the illustrated system can provide a stand time of 12 hours (or in a range 2-50, 4-30, 6-20, 8-15, or 12-24 hours) at a temperature setpoint of 20 K (or in a range 4-77 K, 10-50 K, or 15-30 K; or adjustable in a range covering 20-80 K, 30-50 K, or 25-80 K), with temperature variation at most 200 mK (or in a range 50-1,000 mK, 100-500 mK, or 150-250 mK) over the stand time. Additionally, positional drift of the sample can be held under 1 nm/minute (or under 0.5 nm/min, with the cooling system contributing at most about 0.2 nm/min; or in a range 0.1-10 nm/min, 0.2-5 nm/min, or 0.5-2 nm/min), a vibration can be limited to at most 1 pm rms (or in a range 0.1-10 pm rms, 0.2-5 pm rms, or 0.5-2 pm rms) over a frequency band 1-2000 Hz (or 0.1-20000 Hz, 0.2-10000 Hz, 0.5-5000 Hz, 2-1000 Hz, 5-500 Hz, 10-200 Hz, or 50-100 Hz).

Thermal reservoir 133 can include a solid state thermal reservoir with no moving parts, such as one or more blocks of solid metal, such as erbium, another rare earth element, tin, or combinations thereof. Cooling can be accomplished by thermal energy flow from sample holder 123 to reservoir 133 through strap 136, resulting in gradual warming of reservoir 133 over the course of the stand time. In further examples, battery 130 can include one or more additional thermal reservoirs arranged as substantially concentric volumetric shells around an immediately preceding reservoir. Battery 130 can include one or more cryocoolers and thermal switches as described herein.

Because sample holder 123 can be movable, while thermal reservoir 133 can be mounted immovably because of its mass, strap 136 can be configured for flexible coupling with sample holder 123. In some examples, strap 136 can include a rigid portion (such as a copper rod) and a flexible portion (such as a copper braid). The curved right hand portion of strap 136 schematically a curved or flexible portion of strap 136.

In varying examples, temperature regulator 139 can be a servo-controlled heater, a servo-controlled series regulator, or a passive series regulator, or any combination of such devices. Regulator 139 can be variously attached to other illustrated components. In some examples, regulator 139 can be coupled to thermal strap 136, while in other examples, regulator 139 can be built into thermal strap 136, and in further examples, regulator 139 can be independently coupled to sample holder 123. Temperature regulator 139 is shown positioned within chamber 120, however this is not a requirement and, in other examples, regulator 139 can be located proximate to the reservoir 133 or outside chamber 120. In further examples temperature regulator 139 can be distributed among multiple components. For example, a passive regulator can be positioned proximate to the interface between reservoir 133 and strap 136, an active series throttle can be placed at an intermediate position along strap 136, and/or an active heater device can be placed within sample chamber 123, in various combinations. In other examples, thermal reservoir 133 can include non-metallic solids, liquids, gases, or composite materials in various combinations. For example, reservoir 133 can include solid pellets immersed in a fluid, or closed fluid-filled cells.

Second Example System

FIGS. 2A-2B are diagrams 200-201 illustrating a second example system in which the disclosed technologies can be deployed. FIG. 2A shows an overall view of a TEM column 210 with thermal battery 230 attached, while FIG. 2B is a partial view of the thermal battery 230 coupled to sample chamber 220.

Starting with FIG. 2A, table 240 is attached to frame 244 by vibration isolation mounts 242. In turn, table 240 supports the entire TEM column 210 and the thermal battery 230. As illustrated, duct 256 provides high voltage cabling to electron gun and accelerator 258. Condenser assembly 218 and probe corrector 216 can deliver a focused electron beam to sample chamber 220, which is also coupled to thermal battery 230. The electron beam transmitted through sample chamber 220 passes through image corrector 214 to camera 252. Partially obscured behind thermal battery 230 is a sample load subsystem 254, which is coupled to sample chamber 220.

Turning to FIG. 2B, thermal battery 230 and sample chamber 220 are shown as mirror image to their relative orientation in FIG. 2A. Inside housing 233 a secondary thermal reservoir surrounds a primary thermal reservoir, which are not visible in FIG. 2B, while port 236 encloses annular cold fingers coupling the thermal reservoirs to structures within the sample chamber 220. Cryocooler 264, 266 provides controlled cooling to the thermal reservoirs inside housing 230, and can be decoupled from the reservoirs by means of a thermal switch located inside housing 262. Also visible in FIG. 2B is automatic sample loader 224 providing a load to an opposing sample stage (not shown in FIG. 2B).

First Example Apparatus

Figure 3:
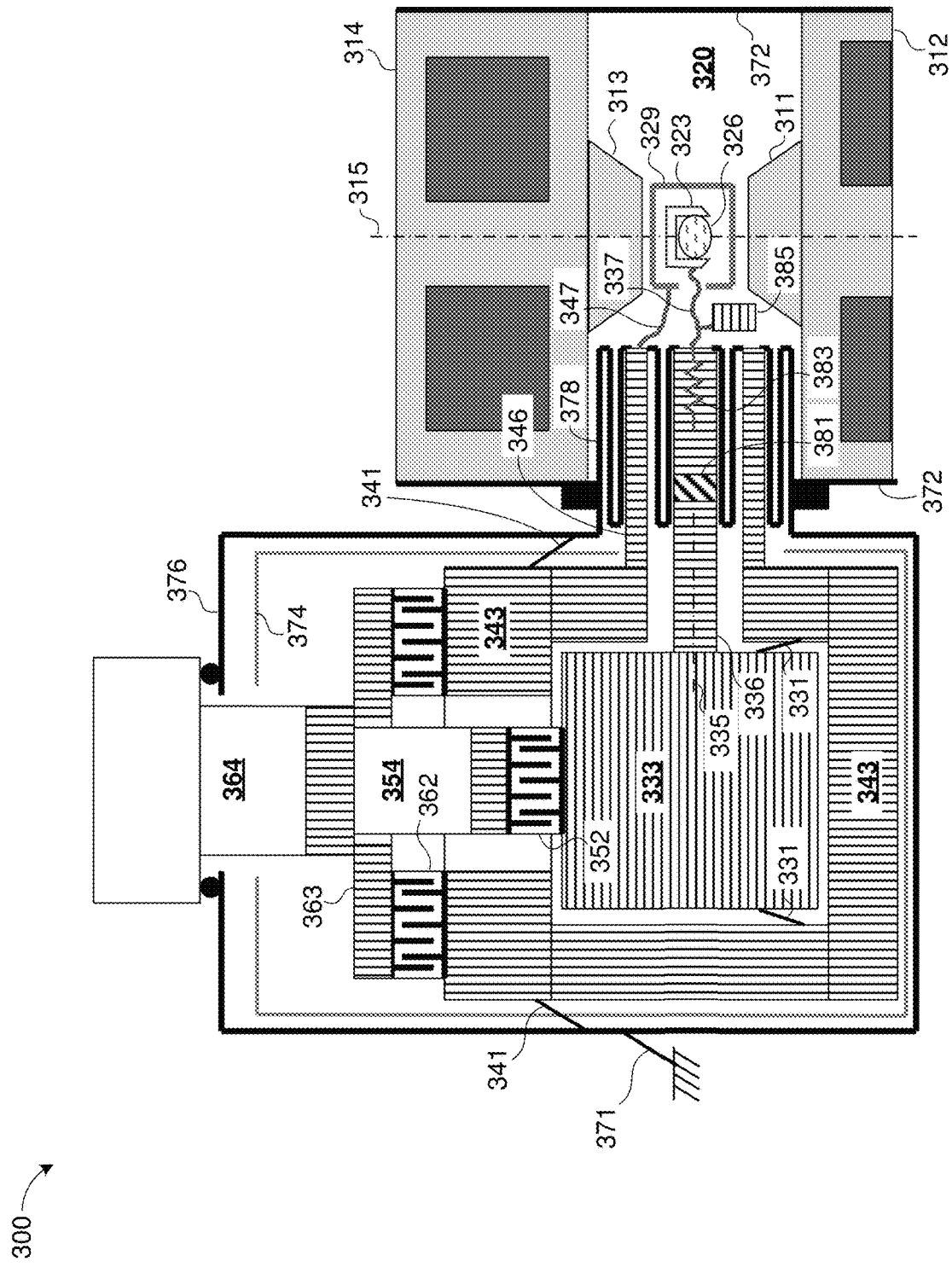
FIG. 3 is a cutaway view of an example apparatus, according to the disclosed technologies, in an analytic equipment environment.

FIG. 3 is a cutaway view 300 of an example apparatus, according to the disclosed technologies, in an analytic equipment environment. On the right side of FIG. 3 is a partial cross-section of an analytic instrument such as an electron microscope, having a central (beam) axis 315. Condenser optics 314 and objective optics 312 are situated on either side of sample chamber 320, within which sample holder 323 can hold a sample 326 within an internal shielded volume defined by shield 329. Pole pieces 313, 311 shape magnetic fields between condenser 314 and objective optics 312, and can severely constrain the space available for components and equipment within or proximate to sample holder 323. For simplicity of illustration, beam apertures are omitted in FIG. 3.

To the left of FIG. 3 is a cross-section of a thermal battery according to the disclosed technologies. Primary thermal reservoir 333 is surrounded by secondary thermal reservoir 343 within vacuum chamber 376. Struts 331 support reservoir 333 inside reservoir 343, struts 341 support reservoir 343 within vacuum chamber 376, and strut 371 represents mechanical support of vacuum chamber 376 from a table, frame, or scaffolding of the analytic equipment. Above reservoirs 333, 343, secondary cryocooler 364 provides cooling to secondary reservoir 343 and primary cryocooler 354 through thermally conductive cap 363. Thermal switch 362 can be in an ON (closed) state when secondary reservoir 343 is being charged, and can be switched to an OFF (open) state when cryocooler 364 is switched OFF during the stand time of the apparatus, to reduce heat losses as portions of the thermal battery warm up at different rates. Primary cryocooler 354 provides cooling to primary reservoir 333 through thermal switch 352. Like switch 362, switch 352 can be in an ON or closed state when primary reservoir 333 is being charged, and can be switched to an OFF or open state when cryocooler 354 is switched OFF during the stand time of the apparatus, to reduce heat losses as portions of the thermal battery warm up at different rates.

Turning to the coupling between reservoirs 333, 343 and components within sample chamber 320, longitudinal member 336 (sometimes referred to as an inner cold finger) can extract heat from sample holder 323 to primary reservoir 333, while longitudinal member 346 (sometimes referred to as an outer cold finger) can extract heat from shield 329 to secondary reservoir 343. Members 336, 346 can have cylindrical shapes about common axis 335, and can be separated from each other and from the main vacuum chambers 376, 372 by fittings 378. In examples, fittings 378 can have serpentine or corrugated cross-section to reduce heat leaks. In the illustrated example, members 336, 346 can be rigid, and can be flexibly coupled by links 337, 347 to sample holder 326 and shield 329 respectively. Shield 329 can serve both as a thermal shield to reduce radiative heat transfer to sample 326, and can also provide protection against stray contaminants (from warm regions in the vacuum chamber 372) reaching sample 326. Similarly, longitudinal member 346 can act as a thermal shield surrounding longitudinal member 336. The vacuum in chambers 376, 372 can provide thermal insulation and can reduce heat leakage to reservoirs 343, 333 and to shield 329, sample holder 333, or sample 326.

Also shown in FIG. 3 are thermal resistor 381, heater 383, and a thermal mass 385.

During the stand time, and absent any compensation or regulation, as reservoir 333 extracts thermal energy from sample 326 and becomes warmer, the thermal energy flow into reservoir 333 can drop and sample 326 can also become warmer. For this reason, compensation or regulation can be included, to maintain constant temperature of sample 326 or sample holder 323 over the stand time, despite gradual warming of the primary reservoir 333. In varying examples, heater 383 can be regulated to maintain the constant temperature of sample 326 or sample holder 323 as reservoir 333 becomes warmer. To illustrate from the perspective of energy flow, if the unregulated heat flow from sample holder 323 to reservoir 333 were to drop from 3 W to 1 W over the stand time, then the temperature-regulating heater 383 can provide about 2 W to the reservoir 333 at the beginning of the stand time, dropping to about 0 W at the end of stand time. In this way, heat extraction from sample holder 323 can be maintained constant at about 1 W over the stand time, consistent with a constant equilibrium temperature of sample 326 or sample holder 323.

Additionally, thermal resistor 381 can be inserted within member 336 to partially decouple reservoir 333 from heater 383. The thermal resistor 381 can be chosen to optimize stand time for a given operating condition and a given heat capacity of the reservoir 333. If the resistance of resistor 381 is too small, heater 383 can produce more heat, which can significantly reduce the stand time. If the resistance of resistor 381 is too large, a larger temperature differential between sample holder 323 and reservoir 333 can be required to extract the desired thermal energy flow from sample holder 323. Accordingly, there can be a decrease in the range of thermal reservoir 333 temperature over which the temperature of sample holder 323 can be maintained, which also leads to reduced stand time. In between these cases, an optimum resistance value of thermal resistor 381 can be selected to maximize stand time.

Finally, FIG. 3 shows a thermal mass 385 coupled to the thermal flow path from sample holder 323 to reservoir 333. Thermal mass 385 can reduce temperature and position fluctuations of sample holder 323, as described further herein. However, mass 385 is an optional feature. According to the design requirements and precise operating parameters, in some examples the thermal mass of member 336 can provide sufficient attenuation without an auxiliary mass 385. In other examples, attenuation of temperature or position fluctuations may not be required.

Varying implementations of flexible thermally conductive links 337, 347 can be used. In some examples, a copper wire braid can be used to provide high thermal conductivity with low transfer of vibrations, while in other examples an untwisted bundle of copper filaments can be used to provide low stiffness (high flexibility). For example link 347 can be implemented as a copper braid, while link 337 can be implemented as a filament bundle. In one example a filament bundle having 2000 copper filaments each with 25 μm diameter can be used.

Example Operating Parameters

For concreteness, a complete thermal battery is described, with reference to FIG. 3 described above and FIG. 5 described below. The described system is for purpose of illustration only, and many variations can be made, including omission of listed components, inclusion of additional components, or modifications to numerical values. All numbers are approximate.

1. Design Requirements

In this example, the design requirement is to maintain sample temperature at a setpoint 20 K, with stability ±0.1 K, for a stand time of 12 hours. Additional requirements are for the contribution of the thermal battery to position drift not to exceed 0.2 nm/minute; for vibrations not to exceed 1 pm rms over a frequency band 0.5-5000 Hz; and for recharging time not to exceed 6 hours. As an extension, the temperature setpoint can be selectable at any value in a range 20-80 K.

2. Thermal Reservoirs The battery can incorporate inner reservoir 333 incorporating 100 kg of erbium, which is charged (cooled) to 6 K and discharged (warmed) to 15 K over the stand time. Outer reservoir 343 can surround the inner reservoir and can incorporate 100 kg of copper. Outer reservoir 343 can provide thermal shielding to inner reservoir 333 and its associated cold finger 336, and can also cool thermal shield 329 inside the sample chamber through its own cold finger 346.

3. Primary Cooling

Primary cooling can be provided by cryocooler 364, such as model PT420 (CryoMech Inc., Syracuse NY), operating between room temperature (hot side) and 50 K (secondary reservoir, cold side). Second cryocooler 354 can provide cooling from 65 K (hot side, secondary reservoir) to 6 K (cold side, primary reservoir). Cryocoolers 354, 364 can be shut off during the stand time to eliminate sources of mechanical vibration. Each cryocooler 354, 364 can be decoupled from its cold side load, by respective thermal switch 352, 362, to reduce heat leaks and prolong the stand time. A commercial gas switch (Chase Research Cryogenics Ltd., Neepsend, Sheffield, UK) or a purpose-built hybrid switch design can be used.

4. Overall Dimensions

Excluding cold fingers, the thermal battery can have a mass of 330 kg, height of 1.1 m, and diameter of 0.35 m.

5. Cool-Down Performance

For a representative system design, a recharge can be completed in 5 hours, starting with inner and outer reservoirs at 15 K and 65 K respectively. Initial charging, from an initial state with the entire battery at 295 K, can be completed in 24 hours. In varying designs, a recharge time can be 3-6 hours, 2-10 hours, or 1-24 hours.

6. Cold Fingers

Each reservoir 333, 343 can be coupled to respective components in the sample chamber with a cold finger 336, 346. Cold finger 346 for outer reservoir 343 can be a copper tube with a rigid attachment to thermal shield 329 (sometimes termed a cryobox) inside sample chamber 320. Cold finger 336, 536 for inner reservoir 333 can be an assembly including a solid copper rod extending into the sample chamber and (optionally) further inside thermal shield 329, 521 and a bridge 586 inside the thermal shield volume extending from one side of sample holder 323, 523 to an opposite side. Each end of the bridge can be flexibly coupled to the sample holder with a copper braid or wire bundle 337, 537. Cold fingers 333, 343 can be coaxial.

7. Temperature Regulation

Figure 10:
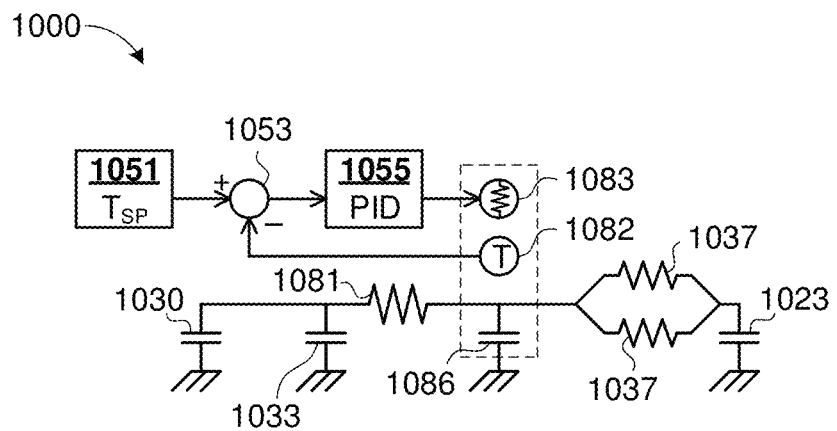
FIG. 10 is a schematic diagram illustrating temperature regulation according to examples of the disclosed technologies.

A temperature sensor 582 and a heater 383, 583 can be mounted on the bridge 586 and driven by a servo loop (FIG. 10). Servo control can be used to regulate the sample temperature.

8. Attenuation of Temperature Fluctuations

For the instant design, the inner cold finger can provide sufficient thermal mass to attenuate temperature and displacement fluctuation and meet corresponding requirements. In other designs a 10-100 g erbium mass 385 (FIG. 9) can be incorporated at the bridge 586.

Specific Heat Capacities of Example Materials

Figure 4:
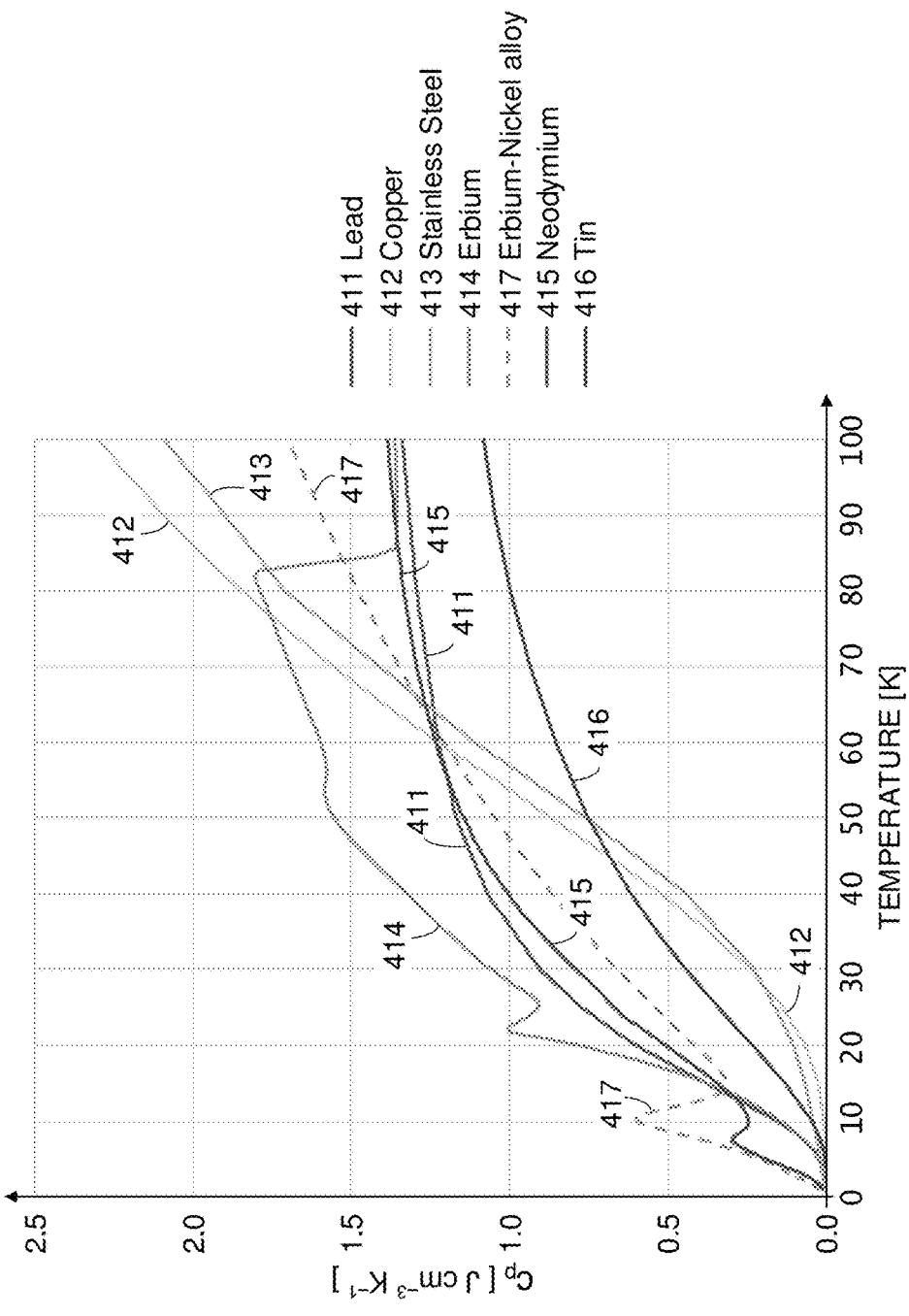
FIG. 4 is a chart illustrating specific heat capacities of example materials at cryogenic temperatures.

FIG. 4 is a chart 400 illustrating specific heat capacities of example materials at cryogenic temperatures. In FIG. 4, specific heat capacity $c_p$ is plotted on the vertical axis, while temperature is plotted along the horizontal axis. The chart covers a range from 100 K down to nearly absolute zero. In the chart 400, solid lines 411-416 are shown respectively for lead, copper, stainless steel, erbium, neodymium, and tin. Dashed line 417 is shown for an erbium-nickel alloy.

In a first aspect, the amount of energy that can be absorbed as a reservoir warms up by an amount $\Delta T$ is proportional to specific heat capacity $c_p$. For this reason, certain examples of the disclosed technology use materials such as erbium, lead, or neodymium for a primary thermal reservoir, all of which have significantly higher $c_p$ (about 5×) in a region of interest 5-20 K as compared to more common materials such as copper, lead, or even tin. Erbium can be chosen in particular examples, for a combination of considerations including ease of handling, regulatory issues, and availability. By comparison, a secondary reservoir designed to warm up from 50-65 K during a stand time can be in a different regime, where a shortfall (about 30%) in $c_p$ for copper or stainless steel, relative to erbium, can be offset based on considerations of handling or availability.

In a second aspect, the chart 400 illustrates steep decreases in $c_p$ as the temperature approaches zero. Because the temperature change $\Delta T$ for a given amount of thermal energy $\Delta Q$ in an object of volume V is given by $\Delta T = \Delta Q/(c_p \cdot V)$, this temperature change $\Delta T$ can rise significantly as temperatures and $c_p$ approach zero. The implication of this phenomenon is that small fluctuations in heat flow can manifest as large fluctuations in temperature, with attendant variations in position due to thermal expansion or contraction. This can make precise temperature regulation challenging, as discussed further herein.

In a third aspect, the chart 400 illustrates non-monotonic behavior for certain materials, most notably for erbium-nickel alloy and erbium, but also to a lesser extent for neodymium. This behavior is associated with phase transitions of the respective materials. The peaks in the graphs of $c_p$ can be applied to achieve increased thermal energy storage based on energy of phase transition (in some contexts known as latent heat).

Second Example Apparatus

Figure 5:
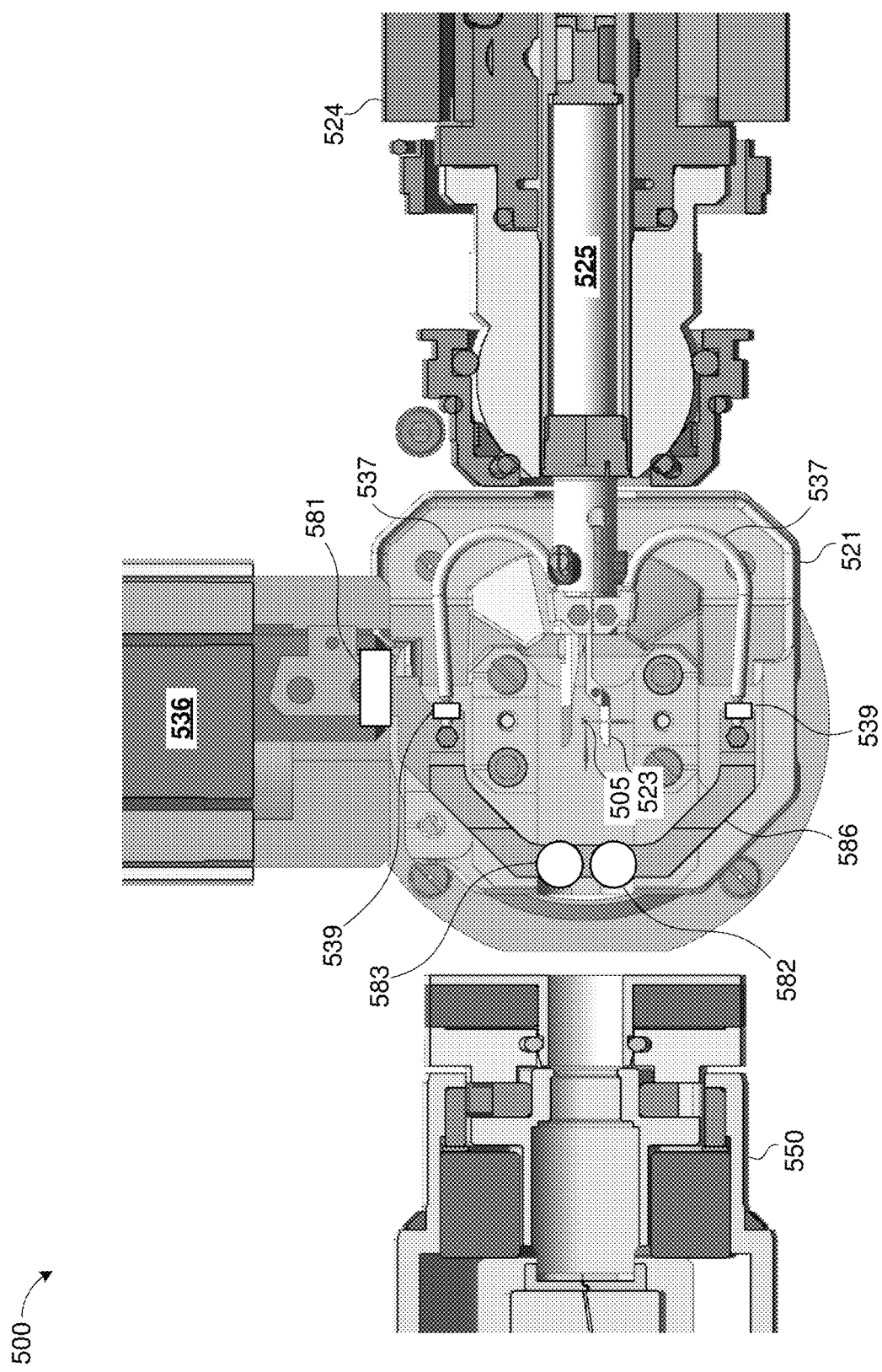
FIG. 5 is a cutaway view of an example sample chamber coupled to a thermal reservoir according to the disclosed technologies.

FIG. 5 is a cutaway view 500 of an example sample chamber coupled to a thermal reservoir according to the disclosed technologies. Cryobox 521 is inside a sample chamber (not shown). In some examples, the sample chamber can form a vacuum enclosure. Sample holder 523 can hold a sample (not shown) at the origin 505 (the center of the cryobox 521, on the beam axis), where the sample can be imaged or analyzed by a beam traveling in a direction perpendicular to the drawing page. Sample holder 523 can be coupled to stage 524 by a thermal insulator 525. Autoloader 550 can deliver a sample to stage 524 and can receive the sample from stage 524 after analytic procedures are complete. Stage 524 can provide translational or rotational adjustments of the sample during analysis. Longitudinal member (cold finger) 536 can extract thermal energy from sample holder 523 to a reservoir (not shown). In this example, cold finger 536 includes a bridge 586; two flexible braids 537 provide thermal coupling between sample holder 523 and member 536. The braids 537 can be sized to allow full range of travel as sample holder 523 moves between its imaging position (as shown) and the autoloader.

Also shown in FIG. 5 are a heater 583 and a temperature sensor 582, which can be used for temperature regulation as described herein. In this example, heater 583 is mounted on bridge 586, to be symmetrically positioned relative to braids 537, but this is not a requirement and other locations for heater 583 can be used. In some examples, heater 582 can be mounted on the main column of cold finger 536. Thermal resistor 581 can provide partial isolation between heater 582 and a thermal reservoir. Likewise, temperature sensor 582 can variously be mounted on a sample holder 523 (either proximate to or remote from the sample), or on a translation stage. In some examples, a bridge-mounted sensor can be used with a calibration applied to account for steady-state or dynamic temperature differences between temperature at bridge 586 and at a sample held in sample holder 523.

In some examples it can be desirable to maintain the sample holder at high voltage relative to the vacuum vessel and member 536. In such examples, high voltage insulators 539 can be incorporated in the thermal path(s) between sample holder 523 and cold finger 536 as shown.

Example Method

Figure 6:
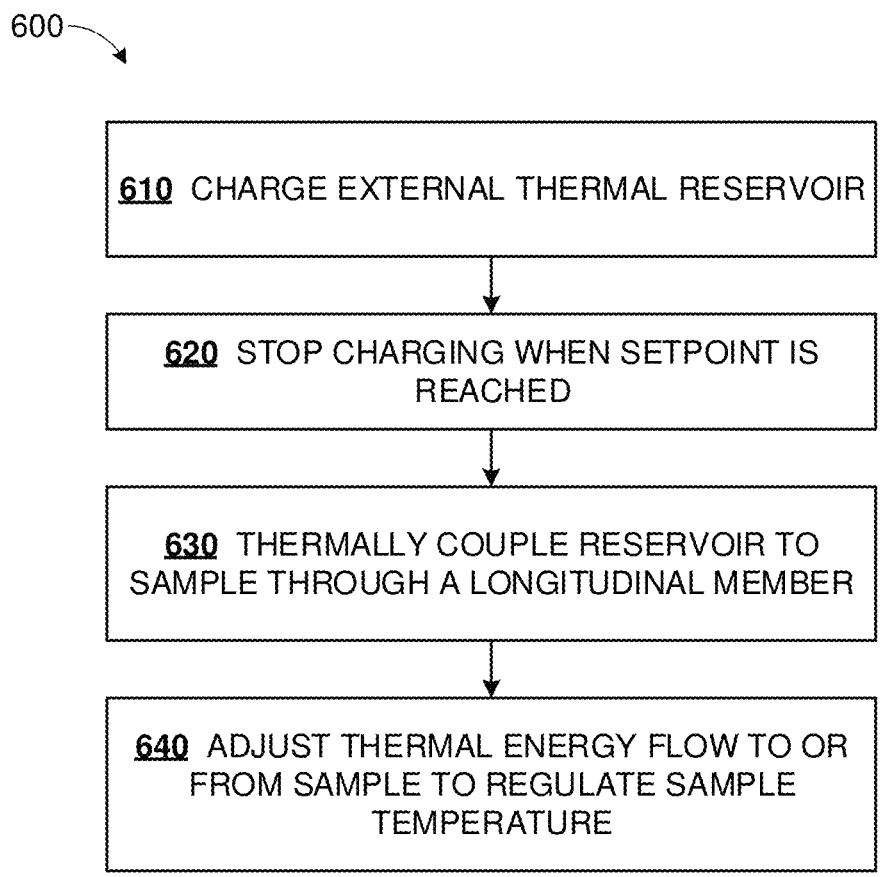
FIG. 6 is a flowchart of a first example method of operating a thermal battery according to the disclosed technologies.

FIG. 6 is a flowchart 600 of a first example method of operating a thermal battery to control the temperature of a sample or sample holder in a sample chamber. At process block 610, a thermal reservoir can be charged. For example, the thermal reservoir can be charged using a cryocooler. The thermal reservoir can be located outside a sample chamber in which the sample is held. At process block 620, the charging can be stopped when a setpoint is reached. In some examples, the setpoint can be a target temperature of the thermal reservoir, while in other examples the setpoint can be a target temperature within the sample chamber. In further examples, the setpoint can be a predetermined time period for the charging operation.

At process block 630, the thermal reservoir can be thermally coupled to the sample through a longitudinal member. In some examples, this action can be performed by the sample holder receiving the sample from an autoloader (e.g. similar to 550) after the reservoir is charged. In other examples, this action can be performed prior to block 610, in cases where the sample is already loaded in the sample chamber. In other examples, a heat switch can be provided between the thermal reservoir and the sample holder. The heat switch can be opened during charging or thermal cycling of the thermal reservoir, and can be closed at process block 630 prior to performing an analytic procedure on the sample.

Then, thermal energy can be extracted from the sample through the longitudinal member to the thermal reservoir, for the duration of the stand time. As the charging has been stopped, the sample can be maintained at a cold operating point, free of mechanical vibrations, with passive extraction of thermal energy to the thermal reservoir. At block 640, thermal energy flow can be adjusted to regulate the sample temperature.

Numerous variations and extensions of the disclosed method can be implemented. In some examples, the temperature regulation can be maintained for a predetermined stand time. At the expiration of the stand time, the method can return to block 610 for another cycle of recharging the thermal reservoir, stopping the charging, and passively extracting thermal energy for another stand time. This cycle can be repeated any number of times.

In additional examples, the regulating can be performed by driving a heater in response to a signal that indicates a temperature within the sample chamber. In further examples, the regulating can be performed, at least in part, by a series temperature regulator. The series temperature regulator can be a variable thermal resistor in a heat flow path between sample holder and thermal reservoir. In some examples, the variable thermal resistor can be actively controlled. Duty cycle control (e.g. pulse-width modulation PWM) between binary states having two distinct thermal resistance values can be used in some embodiments, while continuous analog control can be used in other embodiments. For example, some materials have thermal conductivity dependent on applied magnetic fields In other examples, the variable thermal resistor can be a passive device, whose thermal resistance decreases as the thermal reservoir warms up during the stand time, to present a net thermal resistance that decreases in proportion to the temperature difference between sample holder and thermal reservoir, so that thermal flow is substantially constant, to within a predetermined tolerance, over the temperature swing of the thermal reservoir.

Third Example Apparatus

Figure 7:
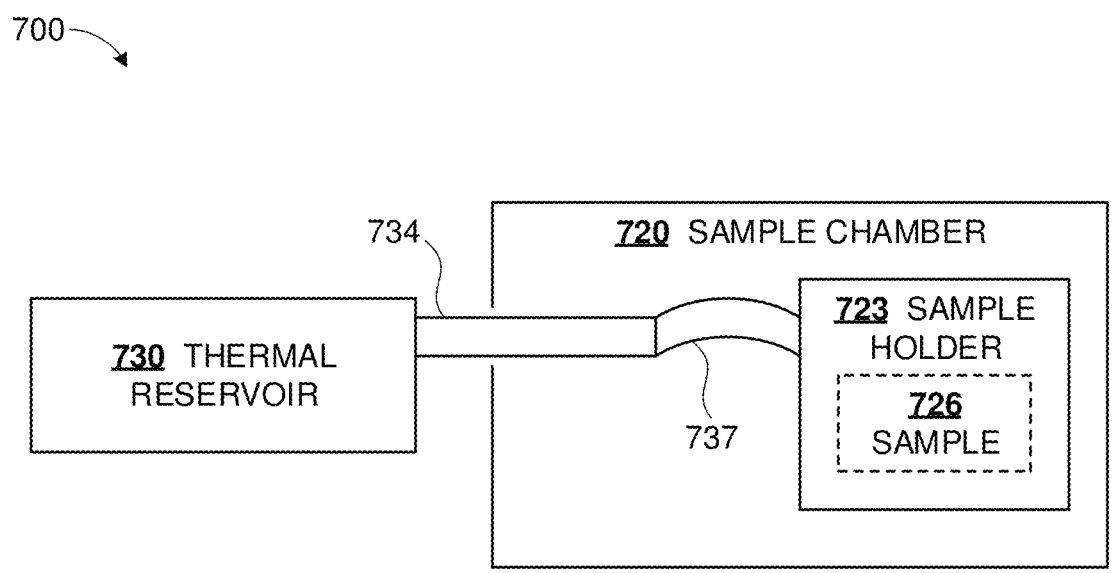
FIG. 7 is a diagram of a first apparatus according to the disclosed technologies.

FIG. 7 is a diagram 700 of a first apparatus coupled to a sample holder in a sample chamber, according to the disclosed technologies. The apparatus comprises a thermal reservoir 730 positioned outside sample chamber 720, and longitudinal member 734 extending from reservoir 730 into sample chamber 720. Member 734 can be flexibly coupled to sample holder 723 within chamber 720. In some examples, the flexible coupling can be provided by flexible member 737 distinct from member 734. Flexible member 737 can be a twisted or braided copper wire. A sample 726 can be retained within sample holder 723.

Numerous variations and extensions can be implemented within the scope of the disclosed technologies. Thermal reservoir 730 can be configured to passively extract thermal energy from sample holder 723 to regulate a temperature of sample holder 723 within a predetermined operating range for at least a predetermined stand time. Thermal reservoir 730 can include a primary thermal reservoir, coupled by member 734 to sample holder 723, as well as a secondary thermal reservoir, also located outside sample chamber 720. The apparatus can also include a second longitudinal member thermally coupling the second reservoir to a thermal shield inside sample chamber 720. Thus, the second reservoir can be configured to passively extract thermal energy from the thermal shield. The second longitudinal member can be annularly disposed around the first longitudinal member 734. The second reservoir can be annularly disposed around the primary reservoir. The primary reservoir can comprise erbium, an erbium alloy, another rare earth metal or alloy, or tin. In other examples, fluids or other solid materials can be used. The secondary reservoir can comprise, tin, copper, stainless steel, lead, or a rare-earth metal or alloy. The apparatus can further include a cryocooler in thermal contact with the secondary thermal reservoir and coupled to the primary reservoir through a thermal switch. The apparatus can be configured to passively extract thermal energy from the sample holder to the primary reservoir with the thermal switch open and the cryocooler switched off. The disclosed technologies can be implemented as a system, comprising the above apparatus together with a TEM. Sample chamber 720 and sample holder 723 can be part of the TEM.

The apparatus can also include a heater and a temperature sensor, each thermally coupled to sample holder 723, and a controller configured to receive a signal from the temperature sensor and drive the heater. The heater can be configured to actively provide thermal energy to sample holder 723 to regulate the temperature of sample holder 723. Thermal energy can flow from sample holder 723 to thermal reservoir 730 along a first path defined by longitudinal member 734. The apparatus can also include a discrete thermal resistor positioned on the first path between the heater and reservoir 730. The thermal resistor can have a thermal conductivity higher than an average thermal conductivity of the member 734. In further examples, the apparatus can include a variable thermal resistor on the first path. The variable thermal resistor can be configured to control a thermal energy flow along the first path, and can assist with regulating the temperature of the sample holder. In some examples, the variable thermal resistor can be a passive temperature regulator, while in other examples, the variable thermal resistor can be actively controlled. The apparatus can include a controller configured to control the variable thermal resistor, for example based on a signal indicating a temperature within the sample chamber. In further examples, the apparatus can include a discrete thermal mass situated within the sample chamber and thermally coupled to the longitudinal member 734 or the sample holder 723.

Different modes of inline regulation can be implemented. A switch-mode regulator can switch the inline resistor between a high thermal resistance state and a low thermal resistance state to maintain (i) thermal energy flow with a constant average value, and (ii) a constant sample temperature. Alternatively, an analog regulator can vary a continuously variable resistor with an analog feedback loop or PID servo controller, to maintain a substantially constant thermal energy flow and a constant sample temperature. Still further, a passive regulator can have a temperature-dependent thermal resistance matched to the operating temperatures, the thermal impedances of a given embodiment, and the precise location of the variable thermal resistor in the thermal flow path, so that the thermal resistance decreases as the thermal reservoir warms up, in such a way that the thermal energy flow can be maintained substantially constant for all values of reservoir temperature within its temperature swing. Finally, regulators can be combined. To illustrate, if a passive regulator is unable to maintain the required sample temperature stability, a passive regulator can be combined with an active regulator. The presence of the passive regulator can dramatically decrease the heating power required from the active regulator: with less excess heat introduced into the system, stand times can be increased, or smaller and lighter thermal reservoirs can be used.

The apparatus can be configured to provide a stand time in a range 2-30 hr at a temperature setpoint between 10-50 K. The sample temperature can be maintained within an operating range having a span between 10 mK and 3 K.

Example Displacement Under Cryogenic Conditions

Figure 8:
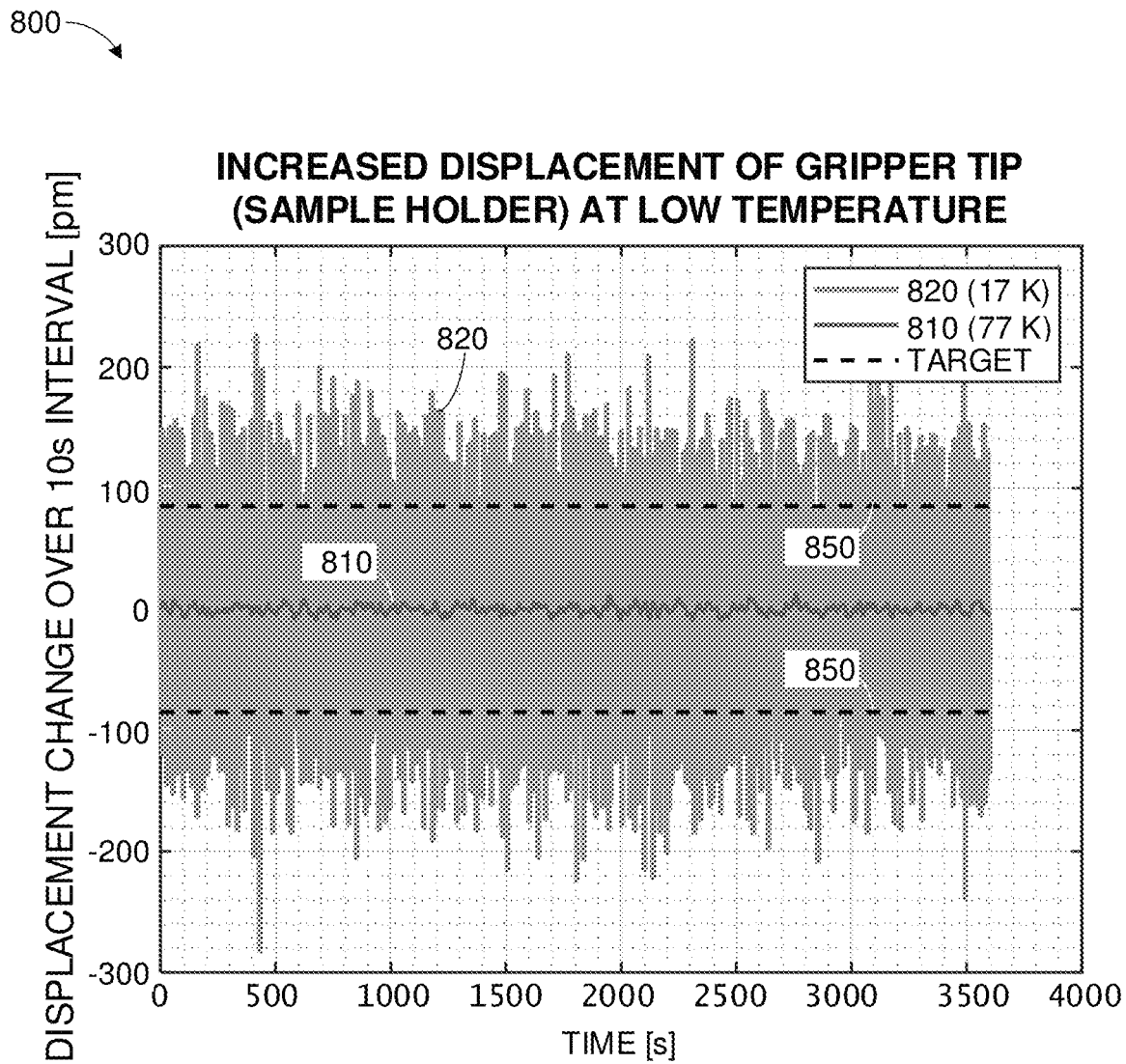
FIG. 8 is a chart illustrating displacement of a sample holder in an example configuration in which the disclosed technologies can be deployed.

FIG. 8 is a chart 800 illustrating displacement of a sample holder in an example configuration in which the disclosed technologies can be deployed. A sample holder in the form of a gripper (similar to 523 of FIG. 5) can experience displacement fluctuations due to its thermal expansion coefficient in the presence of temperature fluctuations. As described herein in context of FIG. 4, the thermal fluctuations can become unacceptably large at very low temperatures because of a drop in specific heat capacity.

In chart 800, the quantity plotted on the vertical axis is the change in displacement of the gripper's tip over a 10 s interval. Time is plotted along the horizontal axis. Line 810 was measured at 77 K, and shows displacements well under ±20 pm. Shaded region 820 was measured at a gripper temperature of 17 K and shows displacement excursions routinely exceeding ±150 pm for the same equipment as line 810. Design target 850 of ±85 pm maximum 10 s displacement change, easily met at 77 K, may not be met at 17 K for the measured configuration.

Example Displacement with Attenuation

Figure 9:
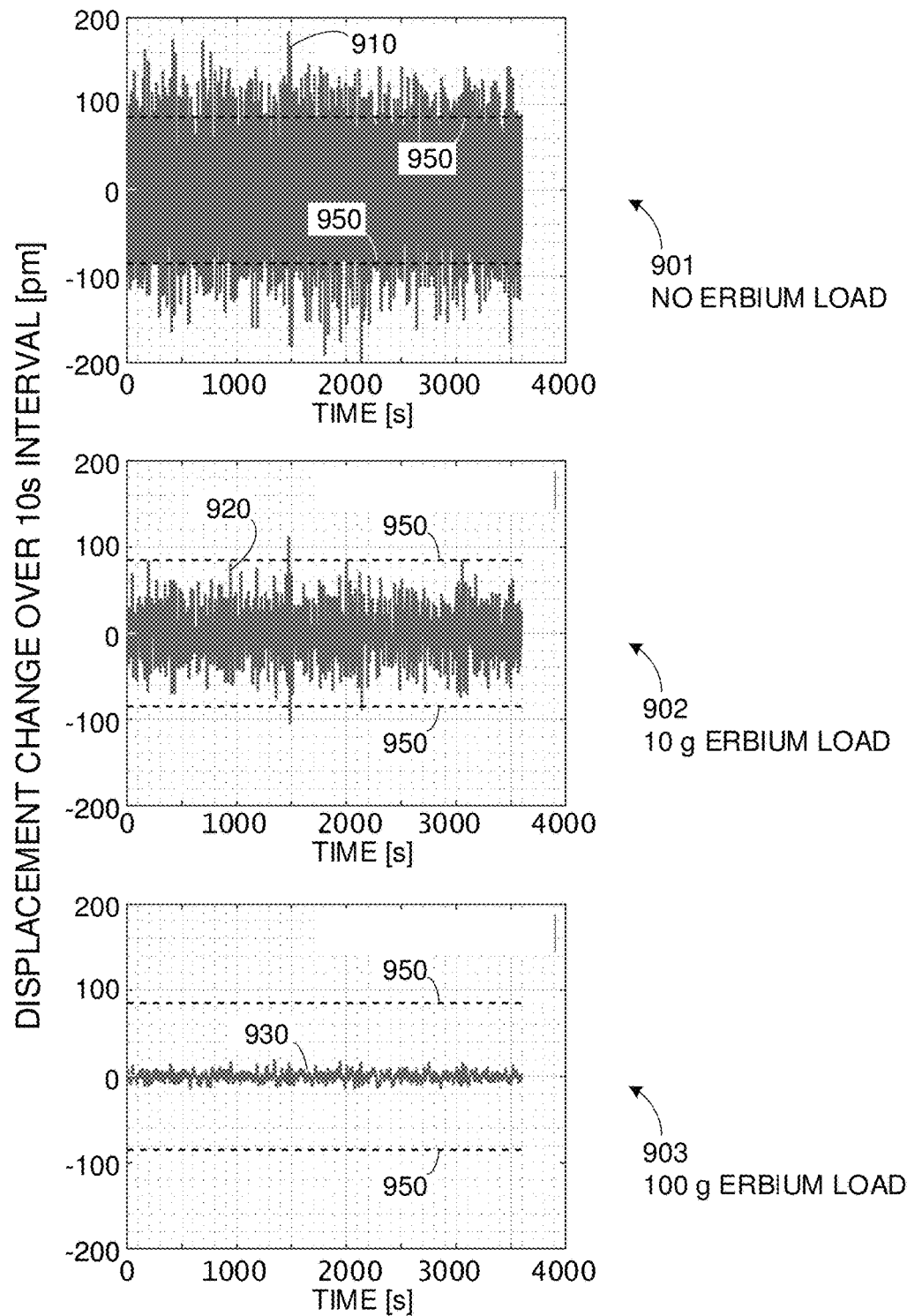
FIG. 9 is a set of charts illustrating displacement of a sample holder with varying thermal masses coupled to the sample holder according to examples of the disclosed technologies.

FIG. 9 is a set of charts 901-903 illustrating displacement of a sample holder with varying thermal masses coupled to the sample holder. For these charts, the sample holder was a gripper tip similar to 523 of FIG. 5, the operating temperature was 17 K, and the thermal mass was erbium. The thermal mass was mounted on a bridge, in a position similar to heater 583 of FIG. 5, with a thermal resistance of 50 K/W between the thermal mass and the bridge. As in FIG. 8, the change in displacement of the gripper tip over a 10 s interval is plotted on the vertical axes, while time is plotted along the horizontal axes. Other values of thermal resistance can be used, e.g. about 10 K/W, or in a range 2 K/W to 200 K/W, or commonly 5 K/W to 100 K/W, or 10 K/W to 50 K/W.

Three series of simulations were made with different thermal masses (similar to 385 of FIG. 3) and a one-second moving average filter. Trace 910 depicts measurements with no erbium load. Thus the difference between traces 910 and 820 is due to the moving average filter; this difference is only about 15%. Trace 920 depicts simulations for a case with a 10 g erbium thermal mass, while trace 930 is for a 100 g erbium thermal mass. The 10 g erbium load is seen to be effective, dropping the displacement by more than 50% relative to chart 910, although the displacement occasionally exceeds the target specification 950. The 100 g erbium load drops the displacement by about 90%; the resulting displacement remains under ±20 μm, and is well under the ±85 pm design target 950.

First Example Thermal Regulation Circuit

FIG. 10 is a schematic diagram 1000 illustrating temperature regulation according to examples of the disclosed technologies. For an assembly incorporating a reservoir, a cold finger, and sample holder, similar to that described in context of FIG. 3 or 5, the heat transfer and thermal behavior are represented by a thermal model. Components of the thermal model are depicted in FIG. 10 using analogous electrical components. Particularly, thermal masses can be represented by electrical capacitors (having one terminal connected to electrical ground), while thermal resistances can be represented by electrical resistors.

Thermal resistor 1081 represents a partial isolation thermal resistor similar to 381 of FIG. 3. Capacitors 1033, 1086 represent respective portions of the longitudinal member on the reservoir side and sample side of thermal resistor 1081. Particularly, thermal mass 1086 can include a bridge similar to 586 of FIG. 5. Capacitor 1030 represents the thermal mass of a primary thermal reservoir similar to 333 of FIG. 3. Capacitor 1023 represents the thermal mass of a sample holder and optionally a typical sample, coupled to mass 1086 by thermal resistors 1037 representing two braids similar to 537 of FIG. 5. In this configuration, heater 1083 and temperature sensor 1082 can be mounted between thermal resistor 1081 and braids 1037 on the longitudinal thermal transfer member (similar to 336 of FIG. 3) including, in some examples, on a bridge (similar to the configuration shown in FIG. 5). A dashed line around components 1082, 1083, 1086 indicates the co-location or close thermal coupling between these three components.

A reference signal 1051 provides a temperature setpoint, and is summed with a temperature signal from sensor 1082 at node 1053, with signs as shown. The error signal is input to a PID controller 1055, the output of which drives heater 1083. Components 1082, 1053, 1055, 1083 form a control loop which can be programmed, based on analysis of the thermal circuit shown in FIG. 10 and design requirements, as is well-known in the art.

Second Example Thermal Regulation Circuit

Figure 11:
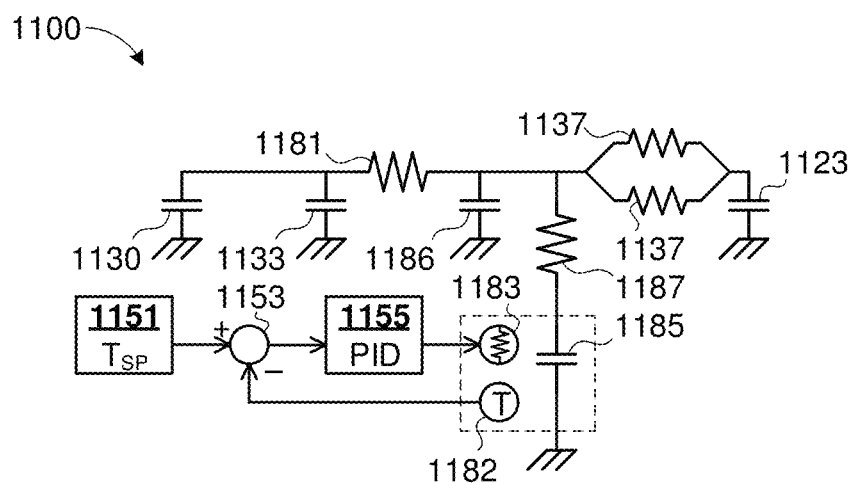
FIG. 11 is a schematic diagram illustrating temperature regulation according to further examples of the disclosed technologies.

FIG. 11 is a schematic diagram 1100 illustrating temperature regulation according to further examples of the disclosed technologies. FIG. 11 uses an electrical representation of a thermal model similar to FIG. 10. Components 1123, 1130, 1133, 1137, 1181, and 1186 are similar to their correspondingly numbered counterparts in FIG. 10 and are not described in further detail. However, the configuration of FIG. 11 includes an additional thermal mass, similar to 385 of FIG. 3, represented by capacitor 1185. In this configuration, temperature sensor 1182 and heater 1183 are mounted on or proximate to the thermal mass 1185, as indicated by dashed outline around these three components. Additionally, component 1187 represents thermal resistance between damping mass 1185 and bridge 1186. The servo loop formed by components 1182, 1151, 1153, 1155, 1183 is similar to the servo loop of FIG. 10 and is not described further. (However, the specific PID configuration of controller 1155 can differ from the configuration of controller 1055, because the respective thermal circuits differ.)

First Example Thermal Switch

Figure 12:
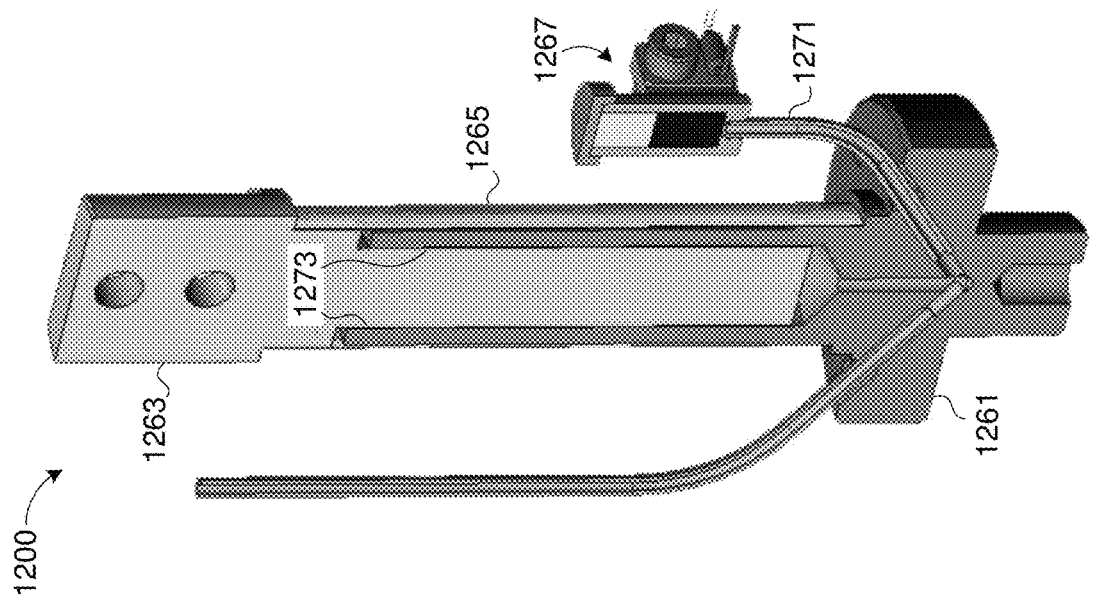
FIG. 12 is a diagram of a first example thermal switch which can be used with the disclosed technologies.

FIG. 12 is a diagram of a first example thermal switch 1200. Switch 1200 can be configured to thermally couple or isolate a cold head 1261 from a hot head 1263. In some examples, switch 1200 can implement switch 352 of FIG. 3, with primary reservoir 333 being cold head 1261 and cryocooler 354 being hot head 1263. In other examples, switch 1200 can implement switch 362 of FIG. 3, with secondary reservoir 343 being cold head 1261 and cap 363 being hot head 1263.

Cold and hot heads 1261, 1263 can be mechanically attached by a sleeve 1265, which can be formed of a low thermal conductivity material such as stainless steel. Operation of switch 1200 can be effected by introducing or removing a gas in the interstitial spaces 1273 between cold head 1261 and hot head 1263. In some examples, a heater-activated getter 1267 can operate switch 1200. As getter 1267 is cooled, gas can be evacuated from interstitial spaces 1273 and gas piping 1271 and the switch 1200 assumes an OFF (open) state with high thermal resistance between cold head 1261 and hot head 1263. Conversely, as getter 1267 is warmed up, gas can be released through piping 1271 and into interstitial spaces 1273, causing the switch 1200 to transition to an ON (closed) state with low thermal resistance between cold head 1261 and hot head 1263.

Second Example Thermal Switch

Figure 13:
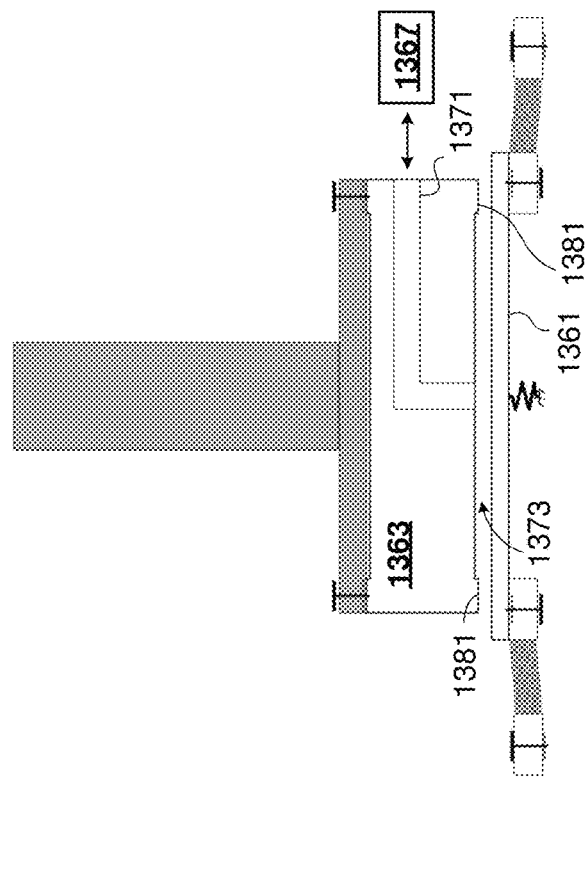
FIG. 13 is a diagram of a second example thermal switch according to the disclosed technologies.

FIG. 13 is a simplified diagram of a second example thermal switch 1300 according to the disclosed technologies. Similar to switch 1200 of FIG. 12, switch 13 can be configured to thermally couple or isolate a cold head 1361 from a hot head 1363. Duct 1371 connects interstitial space 1373 to a gas reservoir 1367. Operation of switch 1300 can be performed by a combination of a mechanical action, to make or break a mechanical contact at contacting surfaces 1381, and a gas operation, to introduce or remove gas from interstitial space 1373. The gas operation can be similar to that of getter 1267 and is not described further. The mechanical action can be a translation to bring cold and hot heads 1361, 1363 into contact, with pressure applied at surfaces 1381 to establish a thermally conducting path between cold head 1361 and hot head 1363, turning the switch ON. The converse operation can separate cold and hot heads 1361, 1363, leaving any solid conduction path between cold head 1361 and hot head 1363 in a high thermal resistance state.

The gas and mechanical actions can be performed simultaneously or in sequence. When switch 1300 is in an ON state, there can be mechanical contact at surfaces 1381 as well as gas conduction across the interstitial space 1373. When switch 1300 is in an OFF state, there can be mechanical separation at surfaces 1381 and evacuation of the interstitial space 1373.

The combination of mechanical action and gas action in hybrid switch 1300 provides advantages over a purely mechanical switch or a purely gas switch. A purely gas switch can require very high surface area of any interstitial space in order to provide high thermal conductance. In contrast, hybrid switch develops the greater share of its ON state conductance through mechanical contact, greatly reducing the area requirement for the gas switch component. A purely mechanical switch can have erratic thermal conductance due to tribological issues in a vacuum. The presence of a gas medium in hybrid switch can alleviate such issues. Hybrid switch 1300 can meet a 10-year or greater lifetime in the field with possible replacement of parts in the field. Accordingly, hybrid switch 1300 can be used in a thermal battery configuration for a TEM with 12 hour stand time.

Example Problems and Solutions

In some examples, a problem of providing vibration-free cooling to a sample in a confined or crowded environment can be solved by providing a solid thermal reservoir outside the sample chamber, wherein the thermal reservoir can be coupled to a sample holder by a cold finger penetrating into the sample chamber. Machinery such as cryocoolers can be switched off after the thermal reservoir is charged.

In some examples, a problem of thermal coupling to a movable sample holder can be solved by flexibly coupling the cold finger to the sample holder. A copper braid, a multi-strand twisted wire, or one or more layers of metal foil can be used as flexible couplings.

In some examples, a problem of regulating the temperature of the sample as the thermal reservoir warms up can be solved by incorporating a temperature regulator to compensate for reduction in heat flow to the reservoir as the reservoir warms up.

In some examples, the temperature regulator can be a heater controlled to maintain substantially constant temperature of a sample, even as the reservoir warms up. The heater power can be controlled based on a signal indicative of a sample temperature or another temperature within the sample chamber.

In some examples, the temperature regulator can be a variable thermal resistor within or inline with the cold finger. The variable thermal resistor can be a passive device whose thermal resistance varies with temperature. Alternatively, the variable thermal resistor can be a device whose thermal resistance can be controlled by an externally applied signal, such as an electrical or magnetic signal.

In some examples, problems of thermal fluctuation or thermally induced position fluctuations can be solved by introducing a thermal mass proximate and thermally coupled to the sample holder. A 10-100 g block of erbium can be used.

In varying examples, any one or more of the above problems can be solved by a suitable combination of the above solutions. In other examples, the above problems can be combined with other problems not listed, or the above solutions can be modified or combined with other solutions not listed.

A Generalized Computer Environment

Figure 14:
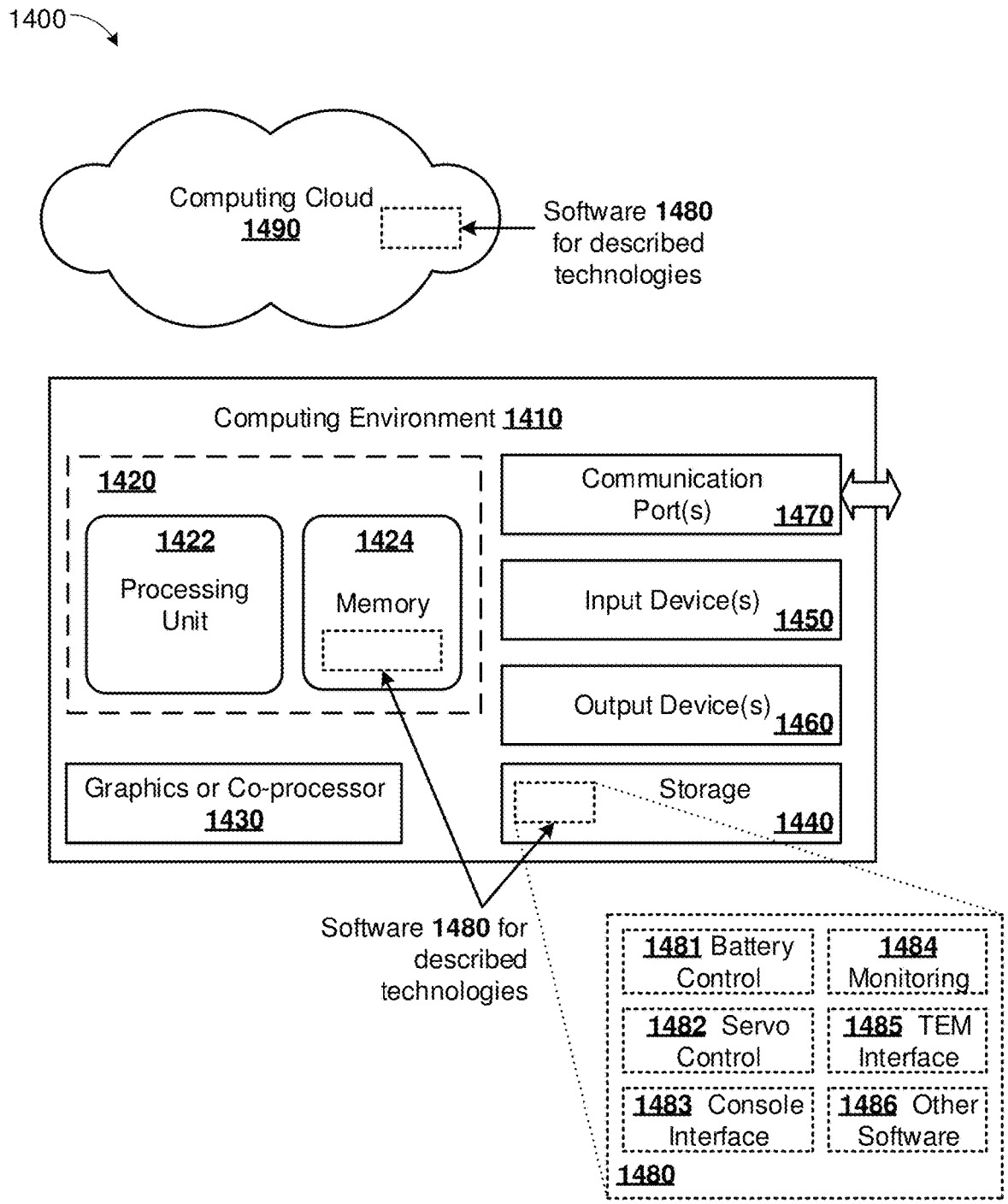
FIG. 14 illustrates a generalized example of a suitable computing environment in which described embodiments, techniques, and technologies pertaining to beam focusing can be implemented.

FIG. 14 illustrates a generalized example of a suitable computing system 1400 in which described examples, techniques, and technologies for operating a thermal battery can be implemented. The computing system 1400 is not intended to suggest any limitation as to scope of use or functionality of the present disclosure, as the innovations can be implemented in diverse general-purpose or special-purpose computing systems. The computing system 1400 can control or monitor a thermal battery, including cryocoolers, thermal switches, servo-controlled temperature regulators, or interfaces with analytic equipment or sample handling systems thereof.

With reference to FIG. 14, computing environment 1410 includes one or more processing units 1422 and memory 1424. In FIG. 14, this basic configuration 1420 is included within a dashed line. Processing unit 1422 can execute computer-executable instructions, such as for control or data acquisition as described herein. Processing unit 1422 can be a general-purpose central processing unit (CPU), a processor in an application-specific integrated circuit (ASIC), or any other type of processor. In a multi-processing system, multiple processing units execute computer-executable instructions to increase processing power. Computing environment 1410 can also include a graphics processing unit or co-processing unit 1430. Tangible memory 1424 can be volatile memory (e.g., registers, cache, or RAM), non-volatile memory (e.g., ROM, EEPROM, or flash memory), or some combination thereof, accessible by processing units 1422, 1430. The memory 1424 stores software 1480 implementing one or more innovations described herein, in the form of computer-executable instructions suitable for execution by the processing unit(s) 1422, 1430. For example, software 1480 can include software 1481 for controlling a thermal battery, software 1482 for servo control, software 1483 for console interfaces, software 1484 for monitoring condition of the thermal battery, sample, or temperature regulators, software 1485 for interfacing with coupled analytic equipment (e.g. TEM), or other software 1486 (including control of a sample stage or load mechanism). The inset shown for software 1480 in storage 1440 can be equally applicable to software 1480 elsewhere in FIG. 14. The memory 1424 can also store control parameters, calibration data, measurement data, or database data. The memory 1424 can also store configuration and operational data.

A computing system 1410 can have additional features, such as one or more of storage 1440, input devices 1450, output devices 1460, or communication ports 1470. An interconnection mechanism (not shown) such as a bus, controller, or network interconnects the components of the computing environment 1410. Typically, operating system software (not shown) provides an operating environment for other software executing in the computing environment 1410, and coordinates activities of the components of the computing environment 1410.

The tangible storage 1440 can be removable or non-removable, and includes magnetic disks, magnetic tapes or cassettes, CD-ROMs, DVDs, or any other medium which can be used to store information in a non-transitory way and which can be accessed within the computing environment 1410. The storage 1440 stores instructions of the software 1480 (including instructions and/or data) implementing one or more innovations described herein. Storage 1440 can also store control parameters, measurement data, reference data, calibration data, configuration data, sample data, or other databases or data structures.

The input device(s) 1450 can be a mechanical, touch-sensing, or proximity-sensing input device such as a keyboard, mouse, pen, touchscreen, or trackball, a voice input device, a scanning device, or another device that provides input to the computing environment 1410. The output device(s) 1460 can be a display, printer, speaker, optical disk writer, or another device that provides output from the computing environment 1410. Input or output can also be communicated to/from a remote device over a network connection, via communication port(s) 1470.

The communication port(s) 1470 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1410, either as an input device 1450 or coupled to a communication port 1470, and can include analog-to-digital converters or connections to an instrumentation bus. An instrumentation control system can be integrated into computing environment 1410, either as an output device 1460 or coupled to a communication port 1470, and can include digital-to-analog converters, switches, or connections to an instrumentation bus.

In some examples, computer system 1400 can also include a computing cloud 1490 in which instructions implementing all or a portion of the disclosed technology are executed. Any combination of memory 1424, storage 1440, and computing cloud 1490 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "charge," "produce," "provide," or "regulate," to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered. Positional terms such as "above," "below," "left," "right," and others are used only for convenient description.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 14, computer-readable storage media include memory 1424, and storage 1440. The terms computer-readable media or computer-readable storage media do not include signals and carrier waves. In addition, the terms computer-readable media or computer-readable storage media do not include communication ports (e.g., 1470).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
    a solid block of metal adapted to be positioned outside a sample chamber and forming a cryogenic primary thermal reservoir;
    a secondary thermal reservoir surrounding the primary thermal reservoir and having a first aperture;
    first struts supporting the primary thermal reservoir inside the secondary thermal reservoir;
    a thermally conductive cap positioned over the first aperture;
    a series arrangement of a primary cryocooler and a first thermal switch coupling the cap to the primary thermal reservoir through the first aperture;
    a second thermal switch coupling the cap to the secondary thermal reservoir;
    a vacuum chamber surrounding the secondary thermal reservoir and having a second aperture;
    a secondary cryocooler having a hot side at room temperature and a cold side coupled to the cap, adapted to cool the cap through the second aperture;

second struts supporting the secondary thermal reservoir within the vacuum chamber;

a longitudinal member extending from the primary thermal reservoir into the sample chamber and flexibly couplable to a sample holder in the sample chamber;

a sleeve extending from the secondary thermal reservoir into the sample chamber and flexibly couplable to a thermal shield surrounding the sample holder, wherein the longitudinal member and the sleeve are coaxial;

fittings coupling the sleeve to the vacuum chamber and to the longitudinal member; and a thermal resistor and a heater positioned within the longitudinal member.

2. The apparatus of claim 1, wherein the primary thermal reservoir is configured to passively extract thermal energy from the sample holder to maintain a temperature of the sample holder within a predetermined operating temperature range for at least a predetermined time duration.

3. The apparatus of claim 2, further comprising:
a temperature sensor thermally coupled to the sample holder; and
a controller coupled to receive a signal from the temperature sensor and to drive the heater;
wherein the heater is configured to actively provide thermal energy to the sample holder to regulate the temperature of the sample holder.

4. The apparatus of claim 2, wherein the thermal energy flows along the longitudinal member from the sample holder to the primary thermal reservoir, and wherein:
the thermal resistor has a variable thermal resistance, and is configured to control a thermal energy flow along the first path longitudinal member.

5. The apparatus of claim 4, further comprising a controller coupled to the thermal resistor and configured to control the thermal resistor.

6. The apparatus of claim 2, further comprising a discrete thermal mass situated within the sample chamber and thermally coupled to the longitudinal member and/or the sample holder.

7. The apparatus of claim 4, wherein the thermal resistor is a passive temperature regulator.

8. The apparatus of claim 2, wherein the predetermined time duration is in a range 2-30 hours and the predetermined operating temperature range has a sample temperature setpoint between 10 K and 50 K and a tolerance between 10 mK and 3 K.

9. The apparatus of claim 1, wherein the apparatus is configured to passively extract thermal energy from the sample holder to the primary thermal reservoir with the first thermal switch in an open state.

10. The apparatus of claim 1, wherein the secondary thermal reservoir comprises copper or a copper alloy.

11. The apparatus of claim 1, wherein the primary thermal reservoir comprises erbium or an erbium alloy.

12. A system comprising:
a transmission electron microscope comprising:
an electron source;
a condenser lens;
a sample chamber;
an objective lens; and
an imager;
a sample holder situated within the sample chamber; and
a regulated thermal battery comprising:
a solid block of metal adapted to be positioned outside the sample chamber and forming a cryogenic primary thermal reservoir;
a secondary thermal reservoir surrounding the primary thermal reservoir and having a first aperture;
first struts supporting the primary thermal reservoir inside the secondary thermal reservoir;
a thermally conductive cap positioned over the first aperture;
a series arrangement of a primary cryocooler and a first thermal switch coupling the cap to the primary thermal reservoir through the first aperture;
a second thermal switch coupling the cap to the secondary thermal reservoir;
a vacuum chamber surrounding the secondary thermal reservoir and having a second aperture;
a secondary cryocooler having a hot side at room temperature and a cold side coupled to the cap, adapted to cool the cap through the second aperture;
second struts supporting the secondary thermal reservoir within the vacuum chamber;
a longitudinal member extending from the primary thermal reservoir into the sample chamber and flexibly couplable to the sample holder;
a sleeve extending from the secondary thermal reservoir into the sample chamber and flexibly couplable to a thermal shield surrounding the sample holder, wherein the longitudinal member and the sleeve are coaxial;
fittings coupling the sleeve to the vacuum chamber and to the longitudinal member; and
a thermal resistor and a heater positioned within the longitudinal member.

13. The system of claim 12, wherein the system is configured to maintain a stable cryogenic condition of a sample in the sample holder for six continuous hours, wherein the stable cryogenic condition comprises:
a temperature variation less than or equal to 200 mK at a temperature setpoint in a range between 20-80 K;
a positional drift of the sample less than or equal to 1 nm/minute; and
vibrations less than or equal to 1 pm rms over a band 1-2000 Hz.

14. The system of claim 12, wherein:
the secondary cryocooler is configured to charge the secondary thermal reservoir with the second thermal switch in a closed state; and
the primary cryocooler is configured to charge the primary thermal reservoir with the first thermal switch in a closed state.

15. A method for cryogenic regulation, comprising:
controlling thermal energy flow through a longitudinal member coupled between a cryogenic primary thermal reservoir and a sample chamber and incorporating a thermal resistor and a heater, wherein the longitudinal member is flexibly couplable to a sample holder in the sample chamber;
wherein the primary thermal reservoir comprises a solid block of metal, positioned outside the sample chamber, supported by first struts inside a secondary thermal reservoir having a first aperture;
extracting thermal energy through a sleeve coaxial with the longitudinal member, from a thermal shield surrounding the sample holder to the secondary thermal reservoir, wherein the sleeve is flexibly couplable to the thermal shield;
extracting thermal energy from the primary thermal reservoir through the first aperture to a cap positioned over the first aperture, by a series arrangement of a first cryocooler and a first thermal switch; and extracting thermal energy from the cap and the secondary thermal reservoir, through a second aperture in a vacuum chamber surrounding the secondary thermal reservoir, by a second cryocooler having a hot side at room temperature and a cold side coupled to the cap, the cap further coupled to the secondary thermal reservoir through a second thermal switch;

wherein the secondary thermal reservoir is supported by second struts inside the vacuum chamber; and wherein the sleeve is coupled by fittings to the vacuum chamber and to the longitudinal member.

16. The method of claim 15, wherein:

the controlling thermal energy flow is performed with the first and second thermal switches in open states; and the extracting thermal energy from the primary thermal reservoir, from the cap, and from the secondary thermal reservoir is performed with the first and second thermal switches in closed states.

17. The method of claim 15, further comprising:

driving the heater in response to a signal indicating a temperature within the sample chamber.

18. The method of claim 15, wherein the thermal resistor is a variable thermal resistor and the method further comprises:

driving the variable thermal resistor responsive to a signal indicating a temperature within the sample chamber.

19. The method of claim 15, wherein the first cryocooler comprises a compressor and an expander, and the method further comprises, after the primary thermal reservoir has reached a target setpoint:

turning off the first cryocooler to reduce mechanical vibration; and changing a state of the first thermal switch from a closed state to an open state.

20. The method of claim 15, further comprising, after performing the controlling thermal energy flow for a predetermined time duration:

at least partially recharging the primary thermal reservoir.

* * * * *

UNITED STATES PATENT AND TRADEMARK OFFICE
CERTIFICATE OF CORRECTION

| | |
|---|---|
| PATENT NO. | : 12,123,816 B2 |
| APPLICATION NO. | : 17/353604 |
| DATED | : October 22, 2024 |
| INVENTOR(S) | : Ronald Lamers et al. |

It is certified that error appears in the above-identified patent and that said Letters Patent is hereby corrected as shown below:

In the Claims

In Column 25, Claim 4, Line 33, delete "first path longitudinal" and insert -- longitudinal --, therefor.

Signed and Sealed this
Twenty-sixth Day of November, 2024

*Katherine Kelly Vidal*

Katherine Kelly Vidal
*Director of the United States Patent and Trademark Office*